(12) United States Patent
Collins et al.

(10) Patent No.: US 7,967,996 B2
(45) Date of Patent: *Jun. 28, 2011

(54) PROCESS FOR WAFER BACKSIDE POLYMER REMOVAL AND WAFER FRONT SIDE PHOTORESIST REMOVAL

(75) Inventors: Kenneth S. Collins, San Jose, CA (US); Hiroji Hanawa, Sunnyvale, CA (US); Andrew Nguyen, San Jose, CA (US); Shahid Rauf, Pleasanton, CA (US); Ajit Balakrishna, Sunnyvale, CA (US); Valentin N. Todorow, Palo Alto, CA (US); Kartik Ramaswamy, San Jose, CA (US); Martin Jeffrey Salinas, San Jose, CA (US); Imad Yousif, San Jose, CA (US); Walter R. Merry, Sunnyvale, CA (US); Ying Rui, San Jose, CA (US); Michael R. Rice, Pleasanton, CA (US)

(73) Assignee: Applied Materials, Inc., Santa Clara, CA (US)

( * ) Notice: Subject to any disclaimer, the term of this patent is extended or adjusted under 35 U.S.C. 154(b) by 980 days.

This patent is subject to a terminal disclaimer.

(21) Appl. No.: 11/801,409

(22) Filed: May 8, 2007

(65) Prior Publication Data
US 2008/0179291 A1    Jul. 31, 2008

Related U.S. Application Data

(63) Continuation-in-part of application No. 11/685,915, filed on Mar. 14, 2007, now abandoned.

(60) Provisional application No. 60/898,645, filed on Jan. 30, 2007.

(51) Int. Cl.
*B44C 1/22*    (2006.01)

(52) U.S. Cl. ............ 216/67; 216/71; 438/709; 438/725; 438/730; 438/731

(58) Field of Classification Search ............... 216/67, 216/71; 438/709, 725, 730, 731
See application file for complete search history.

(56) References Cited

U.S. PATENT DOCUMENTS

| 2,942,428 A | 6/1960 | Morrison |
| 3,692,544 A | 9/1972 | Dendrinos |

(Continued)

FOREIGN PATENT DOCUMENTS

EP    488 393 B    2/1997

(Continued)

OTHER PUBLICATIONS

U.S. Appl. No. 11/685,766, filed Mar. 14, 2007, Collins et al.

(Continued)

*Primary Examiner* — Binh X Tran
(74) *Attorney, Agent, or Firm* — Robert M. Wallace

(57) ABSTRACT

A process is provided for removing polymer from a backside of a workpiece and/or photoresist from a front side of the workpiece. For backside polymer removal, the wafer is positioned near the ceiling to above a localized or remote plasma source having a side outlet through the sidewall of the chamber, and backside polymer is removed by rotating the workpiece while flowing plasma by-products from the side outlet to the wafer backside. For front side photoresist removal, the wafer is positioned away from the ceiling and below the side outlet of the localized plasma source, and front side photoresist is remove by rotating the workpiece while flowing plasma by-products from the side outlet to the wafer front side.

20 Claims, 22 Drawing Sheets

U.S. PATENT DOCUMENTS

| | | | |
|---|---|---|---|
| 4,738,748 A | 4/1988 | Kisa | 156/643 |
| 4,892,753 A | 1/1990 | Wang et al. | 427/579 |
| 5,175,013 A | 12/1992 | Huang | |
| 5,306,379 A | 4/1994 | Kamide | 156/345.42 |
| 5,482,728 A | 1/1996 | Tapfer | |
| 5,858,878 A | 1/1999 | Toda | 439/9 |
| 5,914,278 A | 6/1999 | Boitnott et al. | 436/724 |
| 5,919,510 A | 7/1999 | Fayard | |
| 6,059,985 A | 5/2000 | Yoshimura et al. | 216/37 |
| 6,074,518 A | 6/2000 | Imafuku et al. | 156/345.46 |
| 6,098,637 A | 8/2000 | Parke | 134/1.1 |
| 6,936,546 B2 | 8/2005 | Robbins | 438/707 |
| 7,170,190 B1 | 1/2007 | Treur et al. | 257/798 |
| 7,552,736 B2 * | 6/2009 | Collins et al. | 134/1.1 |
| 2003/0037803 A1 | 2/2003 | Bailey et al. | 134/1.2 |
| 2003/0180704 A1 | 9/2003 | Brockbank | |
| 2004/0137745 A1 * | 7/2004 | Houghton et al. | 438/706 |
| 2004/0166612 A1 | 8/2004 | Maydan et al. | 438/149 |
| 2005/0230350 A1 | 10/2005 | Kao et al. | 216/67 |
| 2005/0281932 A1 | 12/2005 | Ghaffari | |
| 2005/0284576 A1 | 12/2005 | America et al. | |
| 2006/0042651 A1 | 3/2006 | Verhaverbeke et al. | 134/1 |
| 2006/0045722 A1 | 3/2006 | Hashimoto | |
| 2006/0051967 A1 * | 3/2006 | Chang et al. | 438/710 |
| 2006/0102016 A1 | 5/2006 | Ulrich | |
| 2006/0201623 A1 | 9/2006 | Yoo | |
| 2006/0220184 A1 * | 10/2006 | Yin et al. | 257/632 |
| 2007/0215285 A1 | 9/2007 | Kimball et al. | 156/345.48 |
| 2007/0238305 A1 | 10/2007 | Delgadino et al. | |
| 2008/0124919 A1 | 5/2008 | Huang et al. | 438/643 |
| 2008/0156772 A1 * | 7/2008 | Kim et al. | 216/71 |

FOREIGN PATENT DOCUMENTS

| | | |
|---|---|---|
| JP | 9-283459 | 10/1997 |
| JP | 10189515 A | 7/1998 |
| KR | 1985-2674 | 5/1985 |

OTHER PUBLICATIONS

U.S. Appl. No. 11/685,767, filed Mar. 14, 2007, Collins et al.
U.S. Appl. No. 11/685,769, filed Mar. 14, 2007, Collins et al.
U.S. Appl. No. 11/685,770, filed Mar. 14, 2007, Collins et al.
U.S. Appl. No. 11/685,772, filed Mar. 14, 2007, Collins et al.
U.S. Appl. No. 11/685,775, filed Mar. 14, 2007, Collins et al.
U.S. Appl. No. 11/685,902, filed Mar. 14, 2007, Collins et al.
U.S. Appl. No. 11/685,915, filed Mar. 14, 2007, Collins et al.
Goff, et al, "The influence of polysaccharides on the glass transition in frozen sucralose solutions and ice cream", 1993, J. Dairy Sci. vol. 76. No. 5, pp. 1268-1277.
Matte, "Discussion; National Dairy Council of Canada", 2000, pp. 283-287.
Official Action Dated Oct. 5, 2009 in Co-Pending U.S. Appl. No. 11/685,769.

* cited by examiner

PROCESS FOR WAFER BACKSIDE POLYMER REMOVAL AND WAFER FRONT SIDE PHOTORESIST REMOVAL

CROSS-REFERENCE TO RELATED APPLICATIONS

This application is a continuation-in-part of U.S. application Ser. No. 11/685,915 filed Mar. 14, 2007, now abandoned, which claims the benefit of U.S. Provisional Application Ser. No. 60/898,645, filed Jan. 30, 2007. These applications are hereby incorporated by reference in their entireties.

BACKGROUND

Plasma processing of a workpiece or semiconductor wafer, particularly dielectric etch plasma processing, typically employs carbon-containing process gases (e.g., fluorocarbon or fluoro-hydrocarbon gases) that enhance the etch selectivity of dielectric materials, such as silicon dioxide, relative to other materials such as silicon. These processes are used to treat the front (top) side of the wafer on which the microelectronic thin film structures are formed. The opposite (back) side of the wafer is typically un-patterned. One problem is that the carbon-containing process gases tend to form polymer precursors in the plasma, which can leave a polymer residue on the front side of the wafer and on the exposed portion of the backside of the wafer, and even some distance under the unexposed portion of the wafer backside. Such residues should be removed to avoid contamination of later processing steps. The polymer residues deposited on the wafer front side tend to be easily removed with plasma ion bombardment using appropriate chemistry. However, the wafer edge is beveled, and the curved surface on the backside of the wafer edge is also exposed and therefore susceptible to polymer deposition during plasma processing. The backside of the curved surface of the wafer edge is shadowed from ion bombardment during plasma processing so is more difficult to remove, but can be removed in an oxygen plasma at high temperature (e.g., above 300 degrees C). Such difficult-to-remove polymer films require a post-etch polymer removal step using (for example) an oxygen-rich plasma for thorough polymer removal.

In many applications, the plasma etch process is used to form openings (e.g., trenches or contact holes) through multiple thin films on the wafer front side. Such thin film structures can include (for example) a special carbon-containing dielectric film having an ultra-low dielectric constant (ultra low-K film). The ultra low-K film is exposed in cross-section at the side wall of each trench or contact opening formed by the etch process step. Attempting to remove the back-side polymer film by heating and exposing the wafer to an oxygen-rich plasma (during a post-etch polymer removal step) will damage the ultra low-K film by removing carbon from it. In semiconductor structures having 60 nm features sizes (or smaller), such damage to the ultra-low K film is permitted only to a depth of about 3 nm beyond the exposed surface (e.g., 3 nm beyond the sidewall of the opening). In contrast, the polymer film deposited on the wafer backside edge is about 700 nm thick. It is generally difficult if not impossible to avoid damaging the ultra low-K (ULK) film beyond the permissible 3 nm depth while exposing the wafer to an oxygen-rich plasma of a sufficient density and for a sufficient time to remove 700 nm of polymer from the backside of the wafer edge or bevel. The required polymer-to-ULK film etch selectivity (over 200:1) for such a polymer removal process in general cannot be maintained reliably in conventional processes.

In conventional plasma reactor chambers, the wafer support pedestal includes an annular collar surrounding the edge of the wafer. Such a collar tends to shield the wafer edge, but cannot be sufficiently close to the wafer edge to prevent polymer deposition on the backside of the wafer edge. This is because some finite gap between the wafer edge and the collar is required to accommodate variations in the robot wafer placement and tolerance stack-up. Moreover, the wafer edge-to-collar gap tends to increase as successive wafers are etched in the chamber, since the collar is (typically) formed of a process-compatible material (e.g., quartz, silicon or silicon carbide) that is gradually etched away during plasma etch processing of successive wafers. Therefore, it has seemed inevitable that unwanted polymer is deposited on the wafer, including the backside edge of the wafer.

The foregoing problems might be avoided by using a rich mixture of oxygen in the plasma during the initial etch process. However, this approach is not practical if the thin film structure on the wafer includes an ultra-low K film that is exposed on a sidewall of an etched opening. Such a rich oxygen mixture in the etch plasma would cause unacceptable damage to the ultra-low K film.

There is a need for a way of removing polymer from the backside of the wafer (i.e., the backside of the wafer edge) without harming or damaging any low-K film layers in thin film structure.

SUMMARY OF THE INVENTION

A process for processing a workpiece having polymer on its backside and photoresist on its front side. The process includes supporting the workpiece on the backside in a vacuum chamber while leaving at least a peripheral annular portion of the backside exposed. The position of the workpiece defines an upper process zone of the chamber containing the workpiece front side and a lower process zone of the chamber containing the workpiece backside. A localized plasma source is provided adjacent a sidewall of the chamber having an output port coupled to the interior of the chamber. The process further includes confining the front side of the workpiece by holding the workpiece in a first position in the chamber at a reduced workpiece-to-ceiling gap, above the level of the output port of the localized plasma source. The output port of the localized plasma source faces the lower process zone when the workpiece is in the first position. Polymer is removed from the backside of the workpiece by generating a plasma containing polymer etch species in the localized plasma source, and flowing, drifting or diffusing plasma by-products through the output port into the lower process zone. In an embodiment, the process further includes placing the workpiece in a second position below the level of the output port of the localized plasma source. The output port of the localized plasma source faces the upper process zone when the workpiece is in the second position. Photoresist is stripped from a front side of the workpiece by generating a plasma containing photoresist removal species in the localized plasma source, and flowing, drifting or diffusing plasma by-products from the localized plasma source through the output port and into the upper process zone.

In an embodiment, the flowing, drifting or diffusing the plasma by-products toward the backside includes directing the plasma by-products from the output port of the localized plasma source to a target zone of the backside while rotating the workpiece. In a related embodiment, the flowing, drifting or diffusing the plasma by-products toward the front side includes directing the plasma by-products from the output port of the localized plasma source to a target zone of the front side while rotating the workpiece.

BRIEF DESCRIPTION OF THE DRAWINGS

So that the manner in which the above recited embodiments of the invention are attained and can be understood in detail, a more particular description of the invention, briefly summarized above, may be had by reference to the embodiments thereof which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. The drawings in the figures are all schematic and not to scale.

DETAILED DESCRIPTION OF THE INVENTION

Figure 1A:
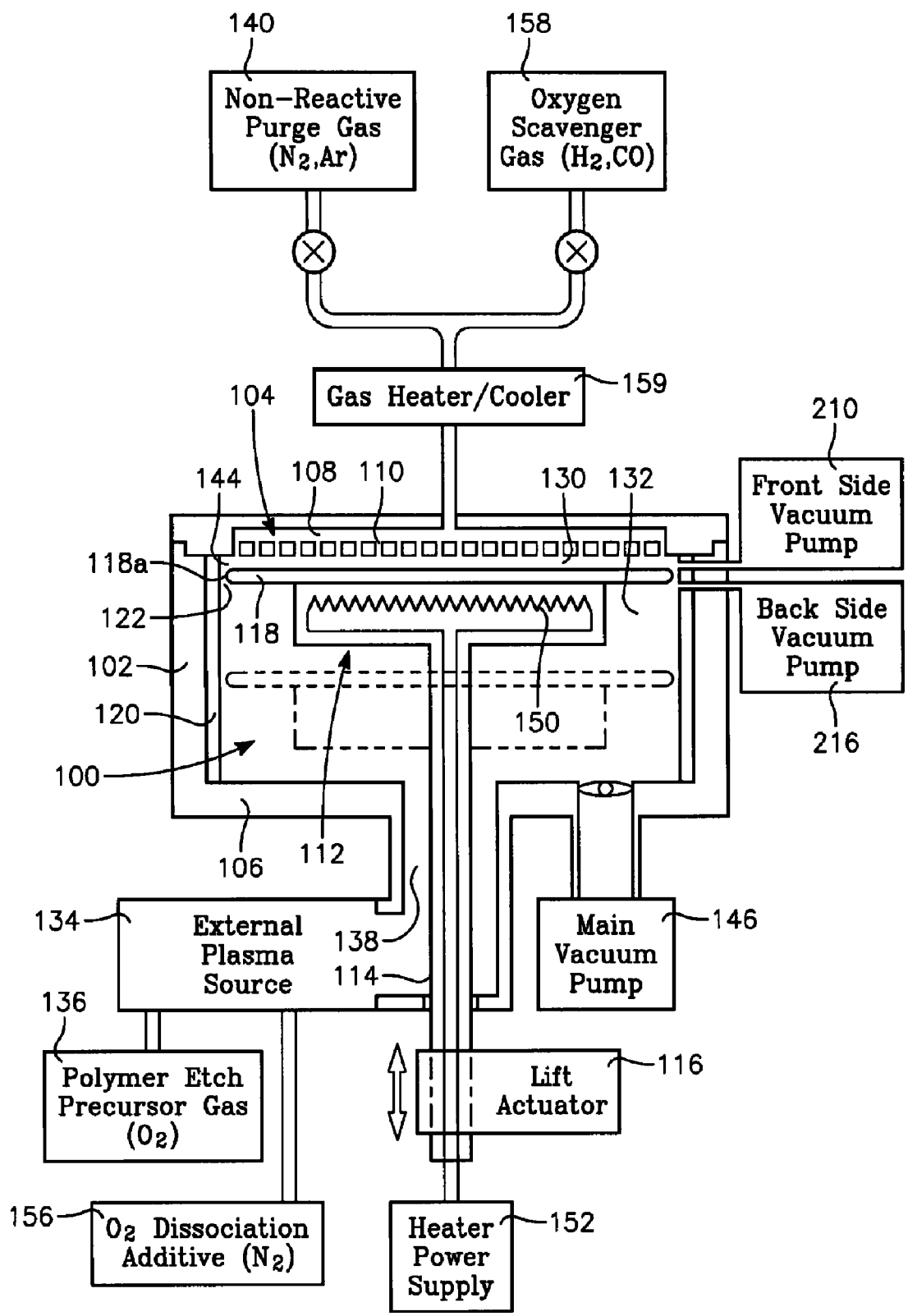
FIG. 1A depicts a backside polymer removal reactor chamber in which polymer etch species are furnished from a first external plasma source toward the backside of the wafer.

Exemplary embodiments of the invention pertain to removing polymer from the backside edge of a wafer without damaging critical films, such as an ultra low-K dielectric film, by heating the wafer in a chamber while exposing only the backside of the wafer to polymer etch radicals or plasma by-products, such as atomic or free oxygen, from an external plasma source. The oxygen radicals may be provided by an external plasma source which is supplied with an oxygen-containing gas or vapor, such as $O_2$, $H_2O$, $N_2O$, $CO_2$, or $CO$, for example. The oxygen-containing gas may be combined or diluted with other gases such as $H_2$, $N_2$ or Ar. Other fluorine-containing gases (such as $CF_4$ or $NF_3$) may be added to allow removal of polymer films that contain other materials (such as Si) and are not etched efficiently in O chemistry alone. The critical films in the thin film structure on the wafer front side are protected from damage by the polymer etch species by pumping purge gases across the wafer front side. In addition, the wafer edge and the chamber side wall are separated by a very narrow gap to define a lower process zone with the wafer backside and an upper process zone with the wafer front side. The narrow of the gap is configured to resist or minimize migration of polymer etch species from the lower to the upper process zone where it would attack the ultra low-K film on the wafer front side. The external plasma source is coupled to the lower process zone so that the polymer etch species are delivered to the wafer back side. Delivery rate and residence time of polymer etch species are minimized in the upper process zone by restricting the height of the upper process region to a very narrow gap between the wafer and the chamber ceiling. The purge gases pumped across the wafer front side may be inert or non-reactive. Such purging reduces the etch rate of the front side critical films relative to the backside polymer removal rate.

In one embodiment, to further reduce the etch rate of the critical films relative to the backside polymer removal rate, the purge gases may be supplemented with or replaced by reactive scavenger gases that chemically scavenge the backside polymer etch species in the upper process region.

In another embodiment, a further increase in the backside polymer etch rate is attained by employing a second (upper) external plasma source coupled to the upper process zone. Gases that are precursors of species that scavenge the polymer etchant are introduced into the upper external plasma source, to produce scavenger radicals for the upper process zone that reduce the amount (partial pressure) of polymer etchant species in the upper process zone. In one embodiment, pressure is maintained sufficiently low pressure in the upper process zone to enable the upper external plasma source to generate plasma efficiently, while simultaneously achieving a sufficiently high flow rate of scavenger species to protect the wafer front side thin films. In another embodiment, unused polymer etch species are removed from the lower process zone before they migrate to the upper process zone. In one embodiment, the upper and lower process zones are separately evacuated near the wafer edge through separate pumping evacuation ports in the sidewall near the wafer edge. In addition, the scavenger species from the upper external plasma source may be heated before they enter the upper process zone.

The scavenger species furnished by the upper external plasma source that removes the polymer etch species from the upper process zone (e.g., hydrogen) may also serve to remove photoresist from the wafer front side. In such a case, photoresist removal may be performed in a separate step in which no polymer etch species are introduced into the lower process zone and the wafer-to-ceiling gap (height of the upper process zone) is increased. In addition, an agent gas (e.g., nitrogen) that promotes the etching of photoresist from the wafer front side may be furnished in a small quantity to the upper external plasma source. In an alternative mode, none of the front side thin film layers is susceptible to damage by the polymer etch species, and the steps of backside polymer etch removal and front side photoresist removal are performed simultaneously using the upper and lower external plasma sources. In this case, the height of the upper process zone is increased by lowering the wafer support pedestal.

In one embodiment, an increase in polymer etch rate relative to etch rate of the critical (ultra low-K) film by the polymer etch species is achieved by locating the lower external plasma source very close to the wafer edge and directing a concentrated stream or jet of plasma products from the lower external plasma source directly at the wafer backside edge while rotating the wafer. By reducing the lower external plasma source pressure, the concentrated stream may consist of polymer etchant ions, radicals and neutrals, while at a higher pressure the stream consists of etchant radicals and neutrals.

Figure 1B:
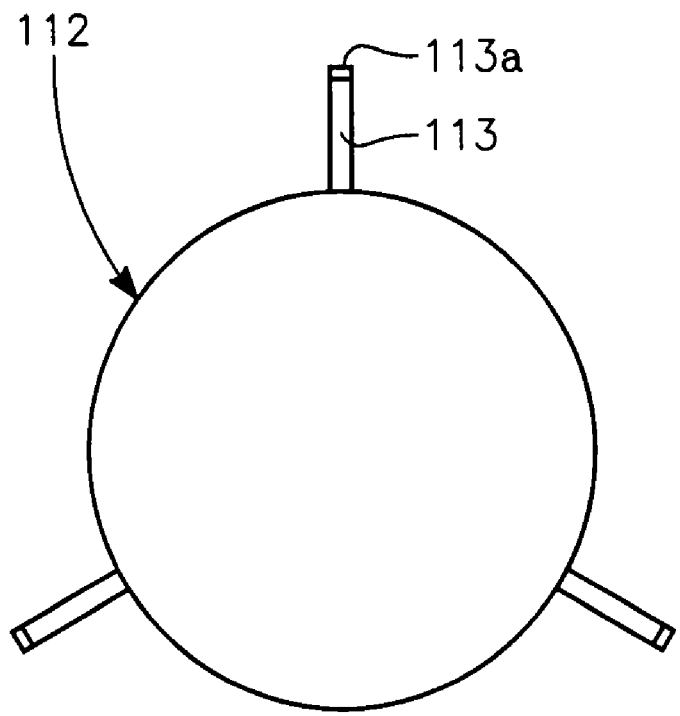
FIGS. 1B and 1C are plan and elevational views, respectively, of an implementation of the workpiece support pedestal in the reactor of FIG. 1A that can be used in each of the reactors described herein.
Figure 1C:
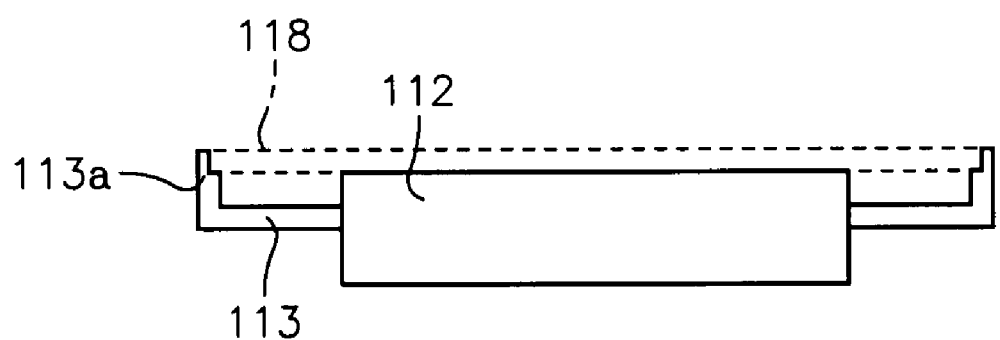

Referring now to FIG. 1A, a plasma reactor for removing polymer residue from the backside of a semiconductor wafer includes a reactor chamber 100 having a side wall 102, a ceiling 104 that is a gas distribution plate and a floor 106. The ceiling or gas distribution plate 104 has an interior gas manifold 108 and plural gas injection orifices 110 opening from the manifold 108 into the interior of the chamber 100. A wafer support pedestal 112 in the form of a disk-shaped table has a diameter less than the diameter of a workpiece to be supported on the pedestal 112, so as to expose the backside peripheral annulus of the workpiece. The pedestal 112 is supported on a lift member 114 elevated and lowered by a lift actuator 116. A workpiece such as semiconductor wafer 118 can be supported with a center portion of its backside resting on the pedestal 112. The front side of the wafer 118 (the side on which the microelectronic thin film structures are formed) faces the ceiling gas distribution plate 104. The pedestal 112 is sufficiently small to leave an annular periphery of the wafer backside exposed, for backside polymer removal. Often, the wafer 118 has a rounded or beveled edge as depicted in FIG. 1A. Such a beveled feature may make it difficult to avoid polymer deposition on the wafer backside during plasma (e.g., etch) processing of thin films on the wafer front side. In one embodiment, radial arms 113 are provided to position the workpiece 118 on the pedestal 112. In one embodiment, three symmetrically spaced thin radial arms 113 shown in FIG. 1B are provided and extended outwardly from the periphery of the pedestal 112. As shown in FIG. 1C, the radial arms 113 are below the workpiece support surface of the pedestal 112 so as to leave the entire peripheral annulus of the workpiece backside exposed for backside polymer removal. Each radial arm 113 supports a thin axial tab 113a at its distal end, the tabs 113a serving to locate the workpiece 118 in coaxial alignment with the pedestal.

The chamber side wall 102 can include a removable liner or process kit 120. Hereafter, the term sidewall 102 is used to include a liner 120 if one is present. A gap 122 between the wafer edge 118a and the side wall 102 is very small, e.g., about 0.2-2 mm, so as to resist migration of gases through the gap 122. The gap is configured to be sufficiently narrow to present a gas flow resistance that is on the order of about one hundred times greater than gas flow resistance in other portions of the chamber. The gap 122 may be on the order of about 1% of the chamber diameter. In this way, the wafer 118 divides the chamber 100 into an upper process zone 130 bounded in part by the front side or top surface of the wafer 118 and a lower process zone 132 bounded in part by the backside or bottom surface of the wafer 118. A bottom external plasma source 134 receives a polymer etch precursor gas from a gas supply 136 and furnishes polymer etch radicals (e.g., oxygen radicals or atomic oxygen) into the lower process zone 132 through a port 138 in the chamber floor 106.

Some polymer etchant (e.g., oxygen) radicals can migrate from the lower process zone 132 into the upper process zone 130 through the gap 122 and pose a risk of damage to critical layers on the wafer front side, such an ultra low-K thin film. In order to prevent this, a non-reactive purge gas, namely a gas that does not react with the thin film materials on the wafer front side, (e.g., nitrogen gas or argon gas) is supplied to the ceiling gas distribution plate 104 from a gas supply 140 in order to flush out the upper process zone 130 and keep it free of etchant species. In order to facilitate a thorough and fast purge of the upper process zone 130, the upper process zone 130 is restricted to a very small height corresponding to a small wafer-to-ceiling gap 144, e.g., about 0.2-2 mm. The gap 144 may be sufficiently small to confine the cross-section of the upper zone 130 to an aspect ratio greater than 100. The upper process zone height (gap 144) is sufficiently small so that residence time of gas in the upper process zone 130 is less than about one tenth to one hundredth of the gas residence time in the lower process zone 132. Also, the upper process zone height (gap 144) is sufficiently small so that gas flow resistance through the gap 144 is on the order of 100 times the gas flow resistance through the lower process zone 132. Such confinement of the upper process zone height may be accomplished by raising the wafer support pedestal 112 with the lift actuator 116.

In one embodiment, pressure in the chamber 100 is controlled by a vacuum pump 146 that maintains the lower process zone 132 at a sufficiently low pressure to draw plasma by-products out of the lower external plasma source 134 and maintain the external plasma source 134 at a sufficiently low pressure to enable it to efficiently generate plasma. Alternatively, the upper and lower process zones 130, 132 may be evacuated separately through separate slit openings near the wafer edge by separate pumps 210, 216. In this case, the vacuum pump 146 may not be necessary.

In one embodiment, the polymer removal process is quickened by heating the wafer 118 to on the order of 300 degrees C., for example, either by an electrical heating element 150 inside the pedestal 112 or by radiant lamps (not shown). An electrical heater power supply 152 is coupled to the heating element 150 through wires in the lift member 114. By raising the wafer temperature to about 300 degrees C, the backside polymer removal rate is significantly increased.

In one embodiment, etching of films (e.g., an ultra low-K film) on the wafer front side is minimized or eliminated by maintaining a very high flow rate of a non-reactive purge gas (e.g., nitrogen or argon) through the ceiling gas distribution plate 104 into the upper process zone 130. This improves the polymer etch selectivity, i.e., the ratio of the polymer etch rate to the ultra low-K film etch rate. The purge gas flow rate may be as high as necessary to achieve a desired etch selectivity, raising the pressure of the upper process zone 130 to a very high level. The pressure in the lower process zone 132 is maintained at a sufficiently low level (e.g., a few Torr or less) to ensure efficient operation of the external plasma source 134. In order for the external plasma source 134 to generate a plasma, the chamber interior pressure of the external plasma source 134 typically should not exceed a few Torr, and because the external plasma source 134 is coupled directly to the lower process zone 132, the pressure in the lower process zone 132 should be maintained at a correspondingly low level. This requirement is met by the main chamber vacuum pump 146 (or by the vacuum pump 216) regardless of the high flow rate of purge gas into the upper process zone 130 through the gas distribution plate 104. This permits the purge gas flow rate and upper process zone pressure to be as great as necessary to eliminate or minimize etching of any ultra low-K film on the wafer front side.

In one embodiment, to further increase the rate of polymer removal from the wafer backside, a dissociation agent gas (e.g., nitrogen) that promotes dissociation of the polymer etch precursor gas (e.g., oxygen) may be supplied at a low flow rate to the external plasma source 134 from a gas supply 156.

In one embodiment, to further reduce the amount of polymer etch species (e.g., oxygen) in the upper process zone 130, a gas supply 158 furnishes an etchant scavenger gas (e.g., hydrogen or carbon monoxide) to the ceiling gas distribution plate 104. This may be instead of or in addition to the non-reactive purge gas from the gas supply 140. Some polymer etchant (e.g., oxygen) atoms or molecules that have migrated into the upper process zone 130 are chemically consumed by combining with the scavenger gas (e.g., H2 or CO). Optionally, this scavenger reaction may be accelerated by heating the scavenger gases furnished to the gas distribution plate 104 with an electrical heater 159. If the polymer etchant precursor gas is oxygen, then the scavenger gas may be carbon monoxide or hydrogen. Carbon monoxide is less reactive with a carbon-containing ultra low-K film than the oxygen gas that it scavenges from the upper process zone 130. Hydrogen gas may be a good choice for the scavenger gas because it may not deplete carbon from the carbon-containing ultra low-K film, and therefore fulfills a requirement of being less reactive with the ULK film than the polymer etch species (oxygen) that it scavenges. The scavenger gas is selected so that the product of the chemical reaction between the scavenger and the polymer etchant (e.g., oxygen) does not react at a high rate with the ultra low-K film. In the case of a hydrogen scavenger and oxygen as the polymer etchant, the product is water and in the case of a carbon monoxide scavenger, the product is carbon dioxide, satisfying the requirement of a scavenging reaction product that is safe for the ultra low-K film.

In an optional mode, the reactor of FIG. 1A is used to remove photoresist from the wafer front side. In this mode, the wafer pedestal 112 may be lowered to the dashed-line position of FIG. 1A, to enlarge the upper process zone 130 with a wafer-to-ceiling gap of about 0.5 to 5 cm. If none of the thin film materials on the wafer front side include a ULK film or other material susceptible to damage from oxygen, then the oxygen radicals from the lower process zone 132 are permitted to migrate into the upper process zone 130 by halting the purge gas flow from the gas supply 140 and/or the scavenger gas flow from the gas supply 158. Also, such migration may be enhanced if the sidewall-wafer gap 122 is greater at the lowered (dashed-line) wafer position. In this optional mode, the backside polymer and the front side photoresist are removed simultaneously.

Figure 2:
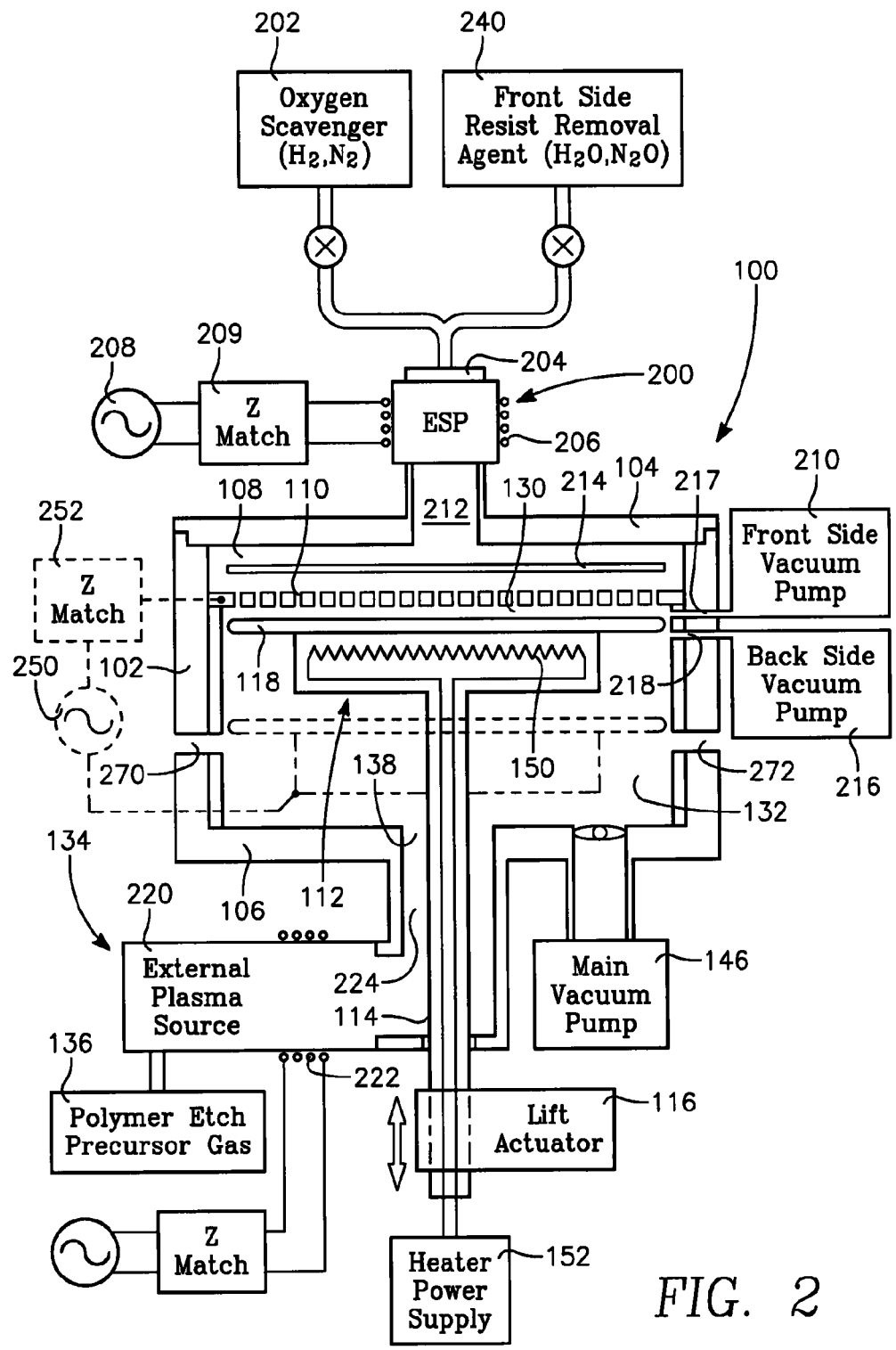
FIG. 2 depicts a modification of the backside polymer removal reactor chamber of FIG. 1A in which etchant scavenger species are supplied from a second external plasma source toward the front side of the wafer.

FIG. 2 depicts a modification of the reactor of FIG. 1A. The reactor of FIG. 2 may be particularly advantageous in providing even greater protection for ultra low-K films on the wafer front side during backside polymer removal. In the reactor of FIG. 2, a second external plasma source 200 is provided. The amount of polymer etchant species (e.g., oxygen) in the upper process zone 130 is reduced more efficiently because the second (upper) external plasma source 200 provides plasma by-products (e.g., radicals) of a scavenger species (e.g., hydrogen or nitrogen) to the ceiling gas distribution plate 104. The scavenger species radicals (hydrogen or nitrogen) chemically scavenge or combine with some polymer etchant species (e.g., oxygen) that may migrate into the upper process zone 130. Such radicals tend to have a faster rate of reaction with the etchant species (than the molecular gas scavenger of the reactor of FIG. 1A) and therefore provide a higher rate of removal of etchant species (e.g., oxygen) from the upper process zone 130. This provides superior protection from attack upon thin film structures (e.g., an ultra low-K film) on the wafer front side. A gas supply 202 furnishes a molecular gas form of a scavenger precursor (e.g., hydrogen or nitrogen gas) to the chamber of the top external plasma source 200. By-products of the plasma generated by the source 200 (e.g., either hydrogen radicals or nitrogen radicals) are scavengers of the polymer etch species (e.g., oxygen), and are delivered to the gas distribution plate 104 to reduce or eliminate oxygen from the upper process zone 130 and thereby protect the thin film structures on the wafer front side.

As depicted in FIG. 2, the top external plasma source 200 may consist of a dielectric (e.g., quartz) tube chamber 204 encircled by an RF coil antenna 206 that is driven by an RF plasma source power generator 208 through an impedance match element 209. The quartz material is compatible with the hydrogen or nitrogen chemistry of the top external plasma source 200. The top external plasma source 200 produces radicals of the scavenger species that are fed to the ceiling gas distribution plate 104 through a center port 212. In order to provide uniform distribution of the scavenger species across the gas distribution plate, a baffle 214 is provided in the center of the gas manifold 108 that blocks direct gas flow from the center port 212 to gas injection orifices 110 near the center of the gas distribution plate 104. A toroidal plasma chamber may be used for either (or both) the top and bottom external plasma sources 200, 134. Such a toroidal chamber consists of reentrant conduit of a conductive material. To accommodate the hydrogen chemistry used in the top external plasma source 200, such a toroidal plasma chamber may include an insulating liner protecting the conductive chamber or conduit.

The chamber pressure within the top external plasma source 200 should be sufficiently low (e.g., not exceeding several Torr) to ensure efficient plasma generation within the external chamber 204. Since the top external plasma source 200 is coupled to the upper process zone 130 (through the gas distribution plate 104), the upper process zone pressure cannot be too high without extinguishing plasma in the external source 200. Meeting this limitation may prevent a sufficiently high flow rate of scavenger species into the upper process zone 130 necessary to protect the wafer front side. In one embodiment, an upper zone vacuum pump 210 is coupled directly to the upper process zone 130 through an upper zone vacuum slit passage 217 that is near (but slightly above, by a few mm or less) the wafer edge and passes through the side wall 102 (and liner 120 if present). The upper zone vacuum pump 210 facilitates or ensures a sufficient flow rate through the very thin wafer-sidewall gap 122. With this feature, the main vacuum pump 146 may be eliminated in the reactor of FIG. 2, as will be discussed below. In one embodiment, the pumping rate of the upper zone pump 210 is maintained at a sufficient level to keep the pressure in the upper process zone 130 below a few Torr, for example. This permits a high flow rate of radicals from the top external plasma source 200 and ensures quick removal of scavenger-etchant reaction by-products from the upper process zone 130. The present embodiment provides a low chamber pressure inside the top external plasma source 200 to facilitate efficient plasma generation within the top external plasma source 200. The present embodiment also reduces the migration of scavenger or purge species into the lower process zone 132 that would otherwise dilute the polymer etch species (e.g., oxygen) at the wafer backside.

In one embodiment, to reduce migration of polymer etchant species (e.g., oxygen) from the lower process zone 132 through the wafer-sidewall gap 122 into the upper process zone 130, a lower zone vacuum pump 216 is coupled to the lower process zone 132 through a lower zone slit passage 218 that is near (but slightly below, by a few mm or less) the wafer edge. The upper and lower slit passages 217, 218, are within a few (or several) mm of each other along the rotational axis of symmetry of the chamber. In the illustrated reactor of FIG. 2, both slit passages 217, 218 are at heights above and below (respectively) the wafer by about 1 mm, although this distance may be in a range of about 0.5 to 2 mm, for example. The slit passage 217, 218 may be axially displaced from one another by about 1-2 mm. Generally the distance is less than the wafer-to-ceiling gap (the height of the upper process zone 130). The upper and lower zone vacuum pumps 210, 216 operate simultaneously to remove through separate slit passages 217, 218 etchant-scavenger reaction by-products (from the upper zone 130 through the slit passage 217) and etchant species and etchant-polymer reaction by-products (from the lower zone 132 through the slit passage 218).

The slit openings 217, 218 have a narrow (e.g., 0.2-2 mm) axial height and extend around at least nearly the entire circumference of the side wall 102. The slit openings 217, 218 are each completely enclosed except for their connections to the respective pumps 210, 216.

In one embodiment, with the upper and lower vacuum pumps 210, 216 providing optimum performance, the main vacuum pump 146 is eliminated in the reactor of FIG. 2. Providing the upper and lower vacuum pumps 210, 216, increases the flux of etchant species to the wafer backside.

The upper and lower vacuum pumps 210, 216 and their slit passages 217, 218 may also be included in the reactor of FIG. 1A, although they may not be required in the reactor of FIG. 1A because of the lack of an upper external plasma source 200 in FIG. 1A. Because the upper external plasma source 200 is not present in the reactor of FIG. 1A, the purge gases may be pumped through the gas distribution plate 104 at very high pressure to protect the wafer front side. Therefore, the local pumps 210, 216 and their slit passages 217, 218 are not necessarily required in the reactor of FIG. 1A.

Various kinds of plasma sources may be used for the upper and lower external plasma sources 134, 200, such as microwave, conventional ICP or toroidal. The process chemistries that are to be used in the upper and lower sources 134, 200 limit the choice of materials. Toroidal reactors typically have metallic chambers or conduits, such as anodized aluminum, which is incompatible with the hydrogen chemistry of the upper plasma source 200. However, toroidal plasma sources are also available with quartz liners or quartz toroidal shaped (round or square) vacuum vessels. If non-metal, non-coated metal, and non-quartz material is required for compatibility with the plasma chemistry, then the choice of external plasma source may be more limited to conventional inductively coupled plasma sources, such as a quartz, alumina, sapphire or yttria tube wrapped with an RF-driven coil, for example. Sources may also be electrostatically shielded to reduce plasma ion bombardment and subsequent erosion or particle/contamination issues. In one example, the lower external plasma source 134 may be a toroidal plasma source, consisting of a toroidal chamber 220 fed by the process gas supply 136, a coiled RF power applicator 222 coupled to the toroidal chamber 220 and a passage 224 from the toroidal chamber 220 to the port 138. The coil 222 may be driven by an RF generator through an impedance match, or may simply driven by a switched power supply (We need to discuss). The toroidal chamber 220 is typically formed of metal with a dielectric external film, such as anodized aluminum, which is compatible with the oxygen and nitrogen gases employed in the lower external plasma source 134. Because the upper external plasma source 200 is supplied with hydrogen gas, anodized aluminum is not a practical material for the upper source 200, and therefore its chamber 204, in one example, is formed of another material (such as quartz) that is compatible with hydrogen.

In an optional mode, the reactor of FIG. 2 is used to remove photoresist from the wafer front side. In this application, oxygen (polymer etchant) flow from the gas supply 136 is halted (or the plasma in the lower source 134 is extinguished). Preferably, this step is carried out with the height of the upper process zone 130 being in the narrow regime (0.2-2 mm) discussed above, to enhance the photoresist removal rate. Alternatively, uniformity of the photoresist removal may be enhanced by increasing the upper process zone height, in which case the wafer pedestal 112 is lowered to the dashed-line position of FIG. 2, to enlarge the upper process zone 130 with a wafer-to-ceiling gap of about 2.5 to 5 cm. Hydrogen radicals or related plasma by-products from the upper external plasma source 200 fill the upper process zone 130 and remove photoresist from the wafer front side in a reactive etch process. This reaction is promoted by supplementing the hydrogen gas flow to the upper external plasma source 200 with an oxygen-containing gas (H2O or N2O) at a lower flow rate from another gas supply 240. The flow rate of the oxygen-containing gas into the upper plasma source 200 may be less than 5% of the hydrogen flow rate. This photoresist removal step may be performed before or after the backside polymer removal step.

In an alternative embodiment of the optional front side photoresist removal mode, a capacitively coupled plasma is generated from the hydrogen in the upper process zone 130 by an RF power generator 250 coupled through an impedance match 252 across the ceiling gas distribution plate 104 and the wafer support pedestal 112 (in its lowered dashed-line position of FIG. 2). In this embodiment, hydrogen ions are generated in the upper process zone 130 to conduct reactive ion etching of the photoresist on the wafer front side.

The initial placement of the reactor of FIG. 2 in a plasma etch system may require replacing one of two single wafer load locks normally present in such a system with the reactor of FIG. 2. An etch system typically includes four plasma etch reactors, two single wafer load locks and a factory interface. For greater versatility, the reactor of FIG. 2 may be configured to perform the functions of the single wafer load lock that it replaces in the plasma etch system. For this purpose, wafer ingress/egress slit valves 270, 272 are provided on opposite sides of the reactor through the side wall 102 (and liner 120). The pair of slit valves 270, 272 enables the reactor of FIG. 2 to function as a single wafer load lock.

Figure 3:
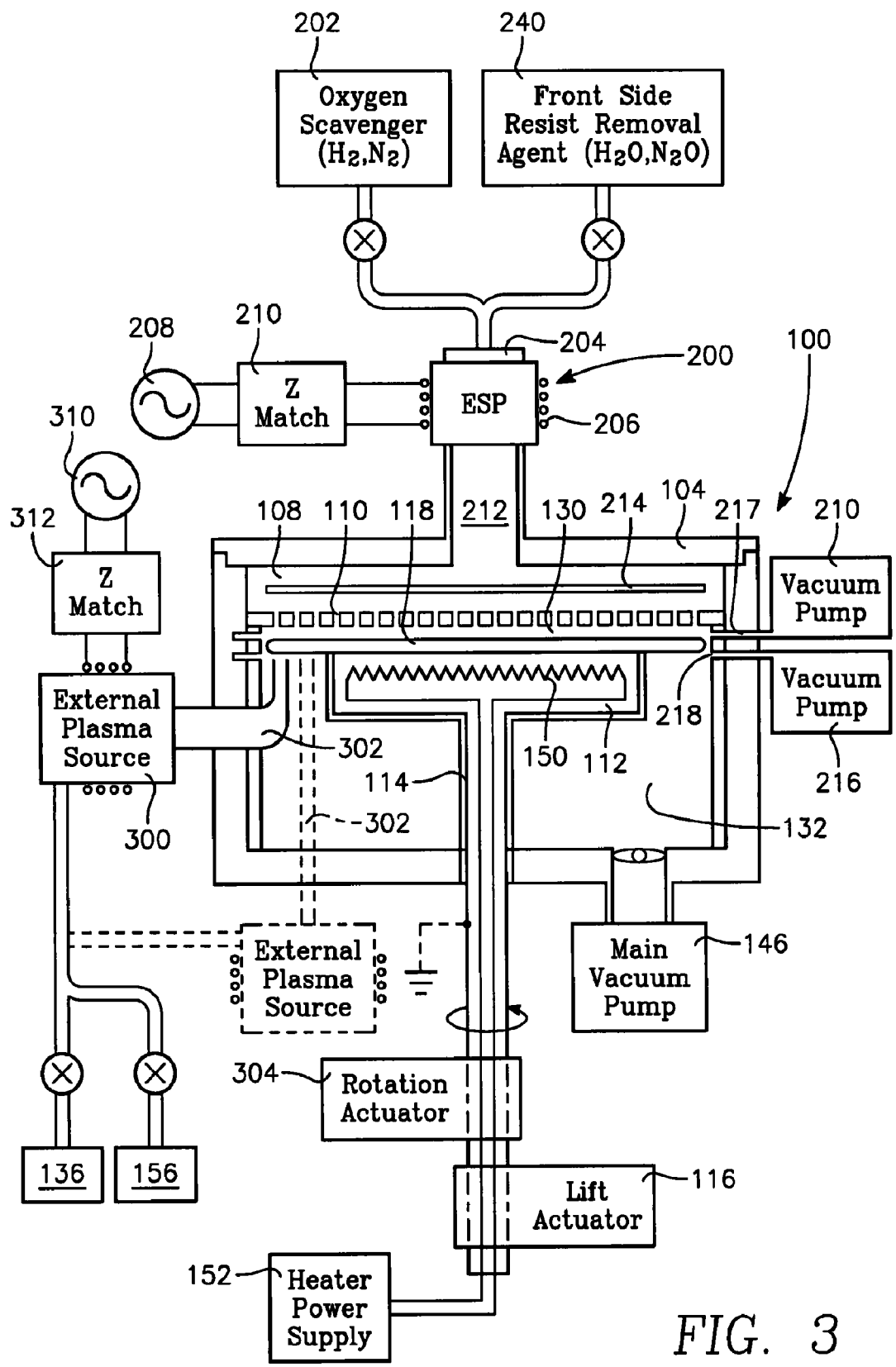
FIG. 3 depicts another backside polymer removal reactor chamber in which a concentrated stream of hot radicals or ions are directed to the wafer backside edge from a separate plasma source that is near the wafer.

Referring to FIG. 3, in one embodiment, a localized stream or jet of plasma radicals, neutrals, and ions of an etchant species is used to provide an even higher rate of backside polymer removal. The stream or jet of plasma species is directed onto a small target area or window of the wafer backside edge while rotating the wafer. For this purpose, a local external plasma source 300 may be located near the wafer edge, and a short conduit 302 directs plasma ions from the interior of the local external plasma source 300 as a localized stream of plasma ions, radicals and neutrals to the small target region at the wafer backside edge. In one embodiment, the conduit 302 is sufficiently short and its output end is sufficiently close to the wafer backside to enable to enable ions from the source 300 to reach the wafer backside. For example, the transit distance between the output end of the short conduit and the wafer support plane of the pedestal 112 may be 5% or less of the pedestal or wafer diameter. A gas supply 136 furnishes a polymer etch precursor gas to the local external plasma source 300. In one embodiment, to expose the entire backside periphery or edge of the wafer to the localized plasma stream, the wafer pedestal 112 is rotated by a rotation actuator 304 coupled to the support member or leg 114 of the pedestal 112. By operating the local external plasma source 300 at a low chamber pressure, it becomes a rich source of plasma ions and electrons, and the concentrated stream from the conduit 302 consists of a large proportion of ions in an ion/radical mixture. By placing the external plasma source 300 close the wafer 118 and keeping the conduit 302 short, ion loss through recombination is minimized, and the particle stream emanating from the conduit 302 remains rich in ions.

In one embodiment, the backside polymer etch rate is increased by the ion jet stream in the reactor of FIG. 3; the ion energy at the wafer backside edge surface may be increased by applying RF bias power between the local external plasma source 300 and the wafer support pedestal. For this purpose, an RF bias power generator 310 is coupled through an impedance match element 312 across the wafer support pedestal and the local external plasma source 300. A gas supply 156 can furnish to the local external plasma source 300 a dissociation agent gas (e.g., nitrogen) that promotes the dissociation of the etchant species (e.g., oxygen) in the plasma of the local external plasma source 300.

If a radical stream is desired rather than an ion stream, then the chamber pressure in the local external plasma source may be increased. Raising the chamber pressure of the local external plasma source 300 reduces the proportion of ions and raises the proportion of radicals in the stream of particles ejected by the conduit 302. Furthermore, if a purely radical stream is required, then it is not necessary to locate the external plasma source 300 near the wafer. Instead, it may be located (for example) near the bottom of the main chamber 100 (as indicated in dashed line in FIG. 3) and the conduit 302 may be relatively long (as shown in dashed line in FIG. 3). The concentrated jet stream from the plasma source 300 can be very hot (e.g., as much as 600 degrees C), and this heat can expedite the reaction between the etch species and the backside polymer. Preferably, the entire wafer is initially heated to about 300 degrees C. before exposing the backside to the concentrated radical or ion stream from the local plasma source 300 and conduit 302.

Figure 4:
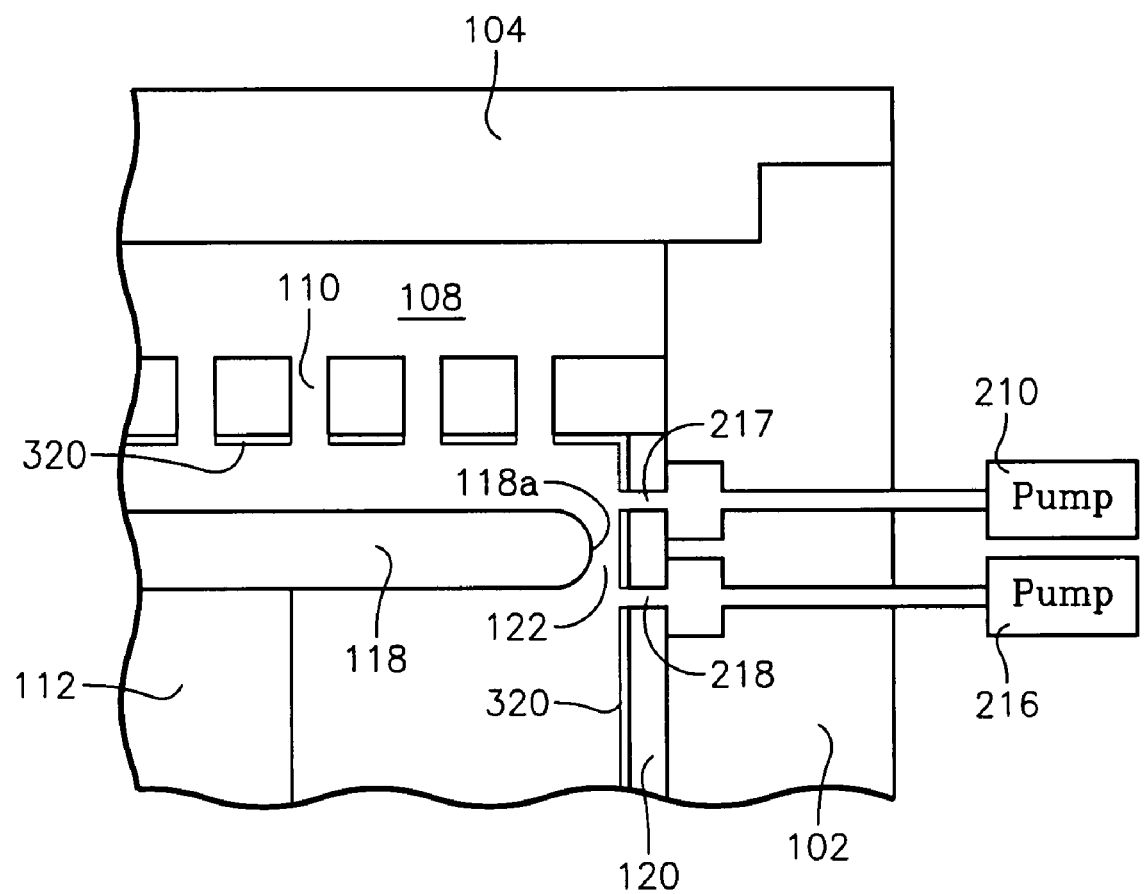
FIG. 4 is an enlarged view of a portion of the chamber of FIG. 3 depicting the placement of special materials to contain the concentrated stream of hot radicals or ions.

Referring to FIG. 4, special precautions may be taken to minimize metal contamination from the ion stream emanating from the plasma source 300/conduit 302. Specifically, metal surfaces can be protected with a dielectric (e.g., quartz) liner 320 that covers the bottom surface of the ceiling gas distribution plate 104 and a dielectric liner 120 that covers the interior surface of the side wall 102. The enlarged view of FIG. 4 shows how each slit opening 217, 218 may open into a larger passage, but is completely enclosed within the chamber wall except for the connection to the respective pump 210, 216.

Figure 5:
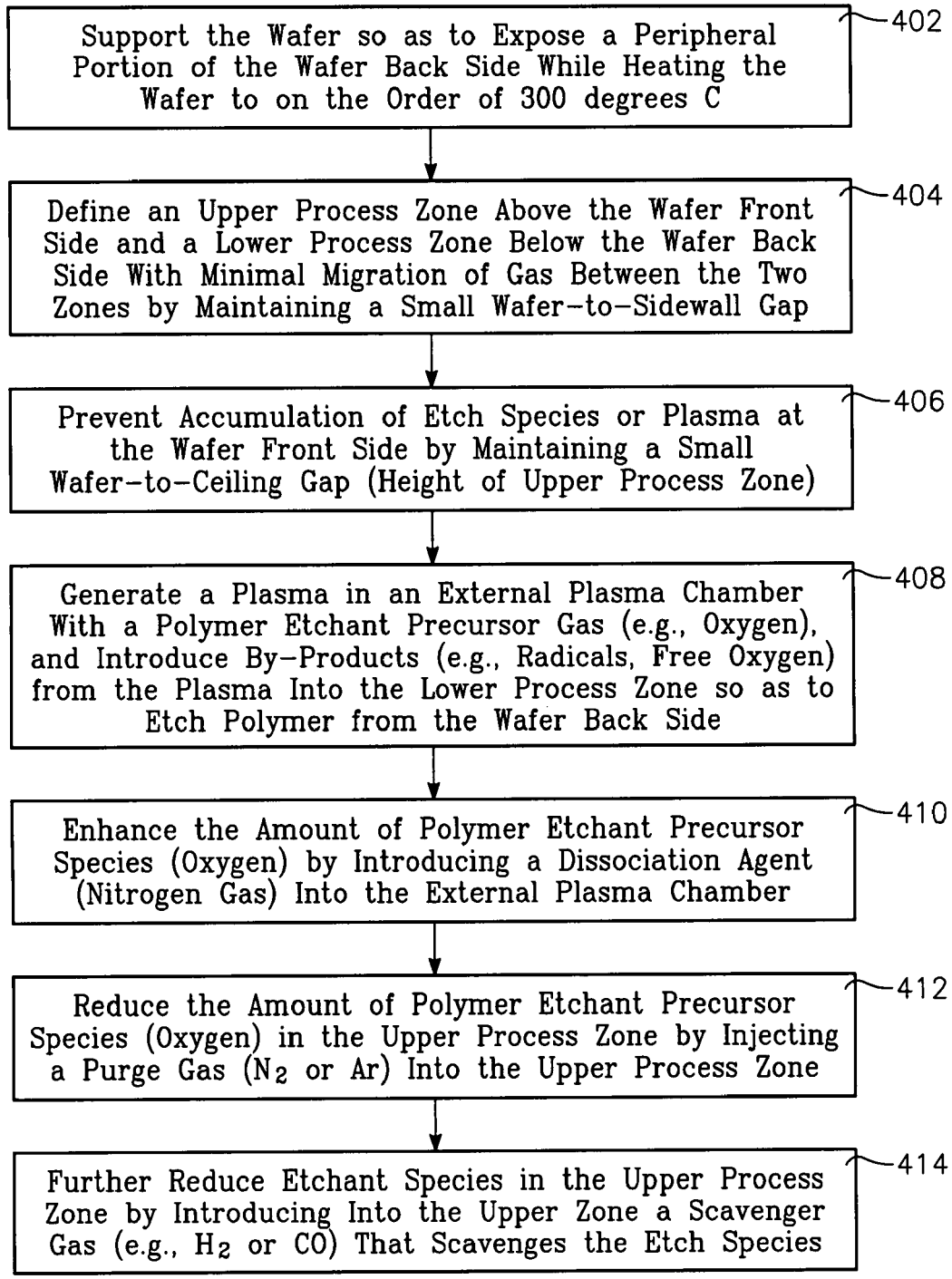
FIG. 5 depicts a backside polymer removal process carried out with the reactor chamber of FIG. 1A.

FIG. 5 depicts an exemplary method that can be carried out in the reactor of FIG. 1A. A first step (block 402) is to support the wafer (using the pedestal 112) so as to expose a peripheral portion of the wafer back side, while beginning to heat the wafer to on the order of 300 degrees C. A next step (block 404), which may begin before the final wafer temperature (e.g., 300 degrees C.) is reached, is to define an upper process zone 130 above the wafer front side and a lower process zone 132 below the wafer back side with minimal migration of gas between the two zones by maintaining a wafer-to-sidewall gap at less than 2 mm. This gap should be sufficiently small to produce a gas flow resistance that exceeds that of other portions of the chamber by a factor on the order of 100. A further step (block 406) is to prevent accumulation of etch species at the wafer front side, or (equivalently) facilitate fast evacuation of the upper zone 130, by maintaining a wafer-to-ceiling gap (the height of the upper process zone 130) at a value at which a high gas flow resistance is established, e.g., less than 2 mm. This gap should be sufficiently small to confine the upper process zone 130 to a cross-sectional aspect ratio greater than on the order of 100. Another step (block 408) is to generate a plasma in an external plasma chamber 134 with a polymer etchant precursor gas (e.g., oxygen), and introduce by-products (e.g., radicals, free oxygen) from the plasma into the lower process zone 132 so as to etch polymer from the wafer back side. A related step (block 410) is to enhance dissociation of the polymer etchant precursor species (oxygen) by introducing a dissociation agent (nitrogen gas) into the external plasma chamber 134. In order to avoid or minimize etching thin films on the wafer front side, a further step (block 412) consists of reducing the amount of polymer etchant precursor species (oxygen) in the upper process zone 130 by injecting a purge gas (e.g., N2 or Ar) into the upper process zone 130. A related step (block 414) consists of further reducing etchant species in the upper process zone 130 by introducing into the upper process zone a scavenger gas (e.g., H2 or CO) that scavenges the etch species (e.g., oxygen). The scavenger gas may be used in addition to or instead of the non-reactive purge gas.

Figure 6:
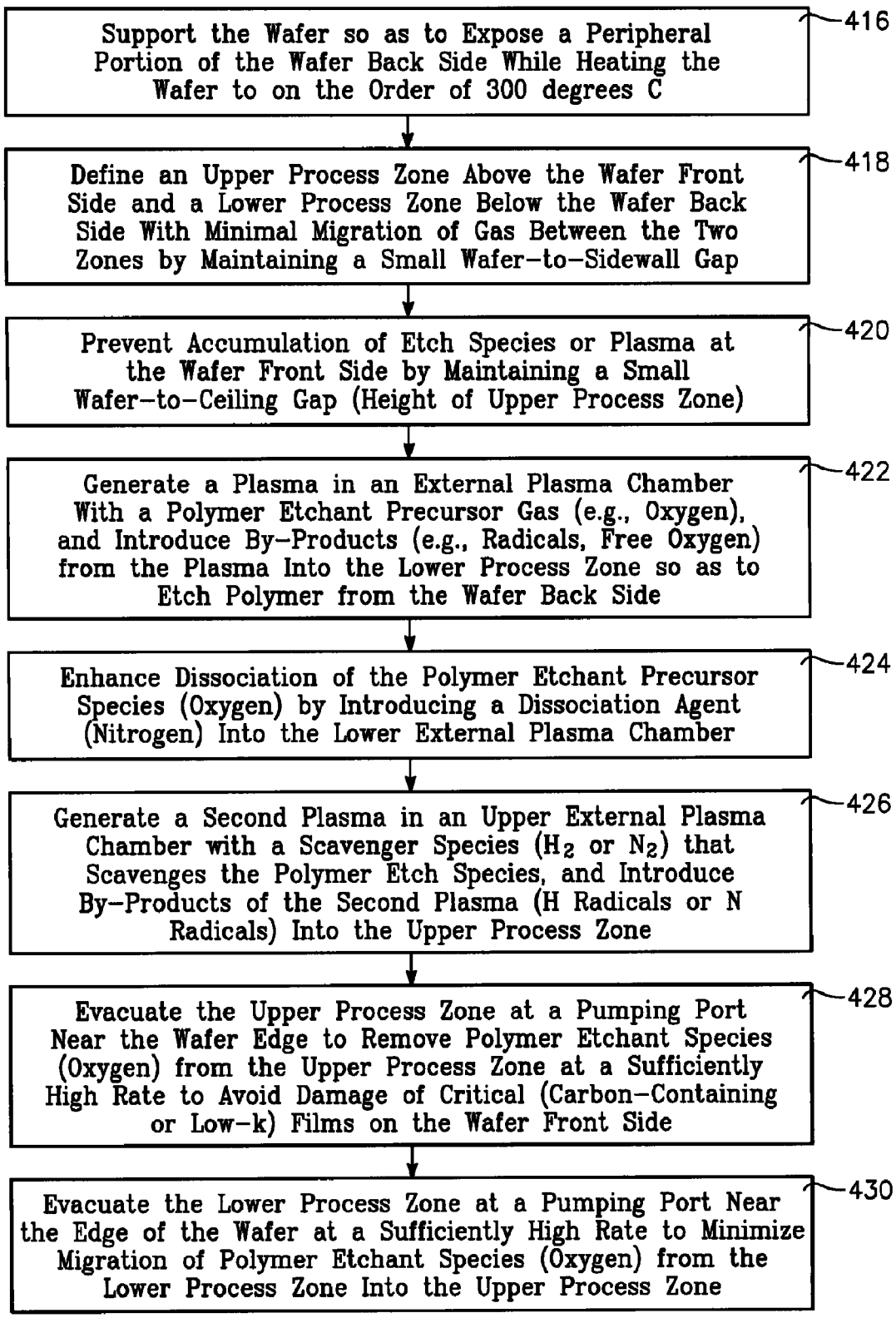
FIG. 6 depicts a backside polymer removal process carried out with the reactor chamber of FIG. 2.

FIG. 6 depicts an exemplary method that can be carried out in the reactor of FIG. 2. A first step (block 416) is to support the wafer on the pedestal 112 so as to expose a peripheral portion of the wafer back side while heating the wafer to on the order of 300 degrees C. A next step (block 418) is to define an upper process zone 130 above the wafer front side and a lower process zone 132 below the wafer back side with minimal migration of gas between the two zones by maintaining a wafer-to-sidewall gap at less than 2 mm. A further step (block 420) is to prevent accumulation of etch species or plasma at the wafer front side by maintaining a wafer-to-ceiling gap (the height of the upper process zone) at less than 2 mm. Another (block 422) step is to generate a first plasma in a lower external plasma chamber 134 with a polymer etchant precursor gas (e.g., oxygen), and introduce by-products (e.g., radicals, free oxygen) from the plasma into the lower process zone 132 so as to etch polymer from the wafer back side. A related step (block 424) is to enhance dissociation of the polymer etchant precursor species (oxygen) by introducing a dissociation agent (nitrogen gas) into the lower external plasma chamber, at a flow rate of 1-10% of the oxygen gas flow rate. Another step (block 426) is to generate a second plasma in an upper external plasma chamber 200 with a scavenger species (H2 or N2) that scavenges the polymer etch species, and introduce by-products of the second plasma (H radicals or N radicals) into the upper process zone 130. In order to reduce or eliminate etching of thin films on the wafer front side, a further step (block 428) is to evacuate the upper process zone 130 at a pumping port 217 near the wafer edge to remove polymer etchant species (oxygen) from the upper process zone at a sufficiently high rate to avoid damage of critical (carbon-containing or low-k) films on the wafer front side. A related step (block 430) is to evacuate the lower process zone 132 at a pumping port 218 near the edge of the wafer at a sufficiently high rate to minimize migration of polymer etchant species (oxygen) from the lower process zone 132 into the upper process zone 130 and to maximize delivery of polymer etchant species to the backside edge of the wafer. For maximum delivery of polymer etch species to the wafer backside edge, only the front side and backside pumps 210, 216, are used, the main pump 146 being eliminated or unused.

Figure 7:
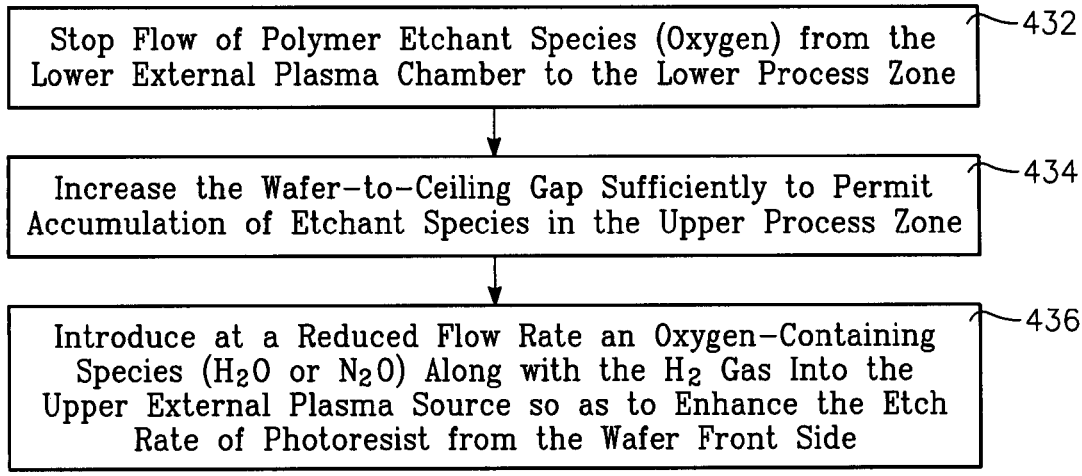
FIG. 7 depicts a group of additional steps for the process of FIG. 6 for removing photoresist from the wafer front side.

FIG. 7 depicts an exemplary method carried out in an optional mode of the reactor of FIG. 2, in which the reactor is employed to etch photoresist from the wafer front side. A first step (block 432) is to stop the flow of polymer etchant species (oxygen) from the lower external plasma source 134 to the lower process zone. Although it is preferable to continue to restrict the height of the upper process zone 130, optionally this height may be increased in preparation for the frontside photoresist removal step, in which case the next (optional) step (block 434) is to increase the wafer-to-ceiling gap to a distance (e.g., 0.5-5 cm) at which etchant species can accumulate in the upper process zone 130. However, it is not necessarily required to increase the upper process zone height in order to perform photoresist stripping on the wafer front side. The next step (block 436) is to introduce at a reduced flow rate an oxygen-containing species (H2O or N2O) along with the H2 gas into the upper external plasma source 200 (at a flow rate of less than 1-10% of the hydrogen gas flow rate) so as to enhance the etch rate of photoresist from wafer front side. The process of FIG. 7 may be performed either before or after the process of FIG. 6. The removal rate of photoresist in this step is enhanced if the height of the upper process zone 130 is restricted to the narrow (0.2-2 mm) range. In the other hand, uniformity is enhanced by increasing this height, and the step of block 434 may only increase the upper process zone height by a fractional amount.

Figure 8:
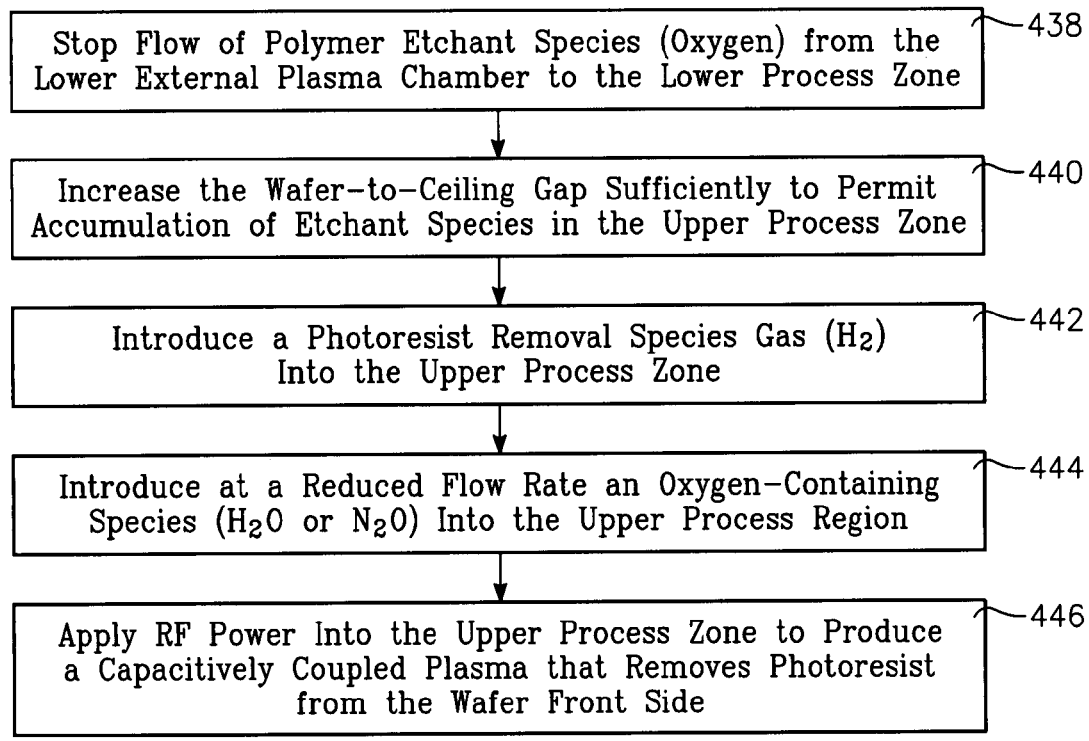
FIG. 8 depicts an alternative group of additional steps for the process of FIG. 6 for removing photoresist from the wafer front side.

FIG. 8 depicts an alternative method for the reactor of FIG. 2 to etch photoresist from the wafer front side, in which a capacitively coupled plasma is generated in the upper process zone 130. A first step (block 438) is to stop the flow of polymer etchant species (oxygen) from the lower external plasma chamber 134 to the lower process zone, and then (block 440) increase the wafer-to-ceiling gap to about 2 to 5 cm. A next step (block 442) is to introduce a photoresist removal species gas (H2) into the upper process zone 130. A further step (block 444) is to introduce at a reduced flow rate an oxygen-containing species (H2O or N2O) into the upper process region. This reduced flow rate may be about 1-10% of the hydrogen gas flow rate. A next step (block 446) is to apply RF power into the upper process zone to produce a plasma that removes photoresist from the wafer front side.

Figure 9:
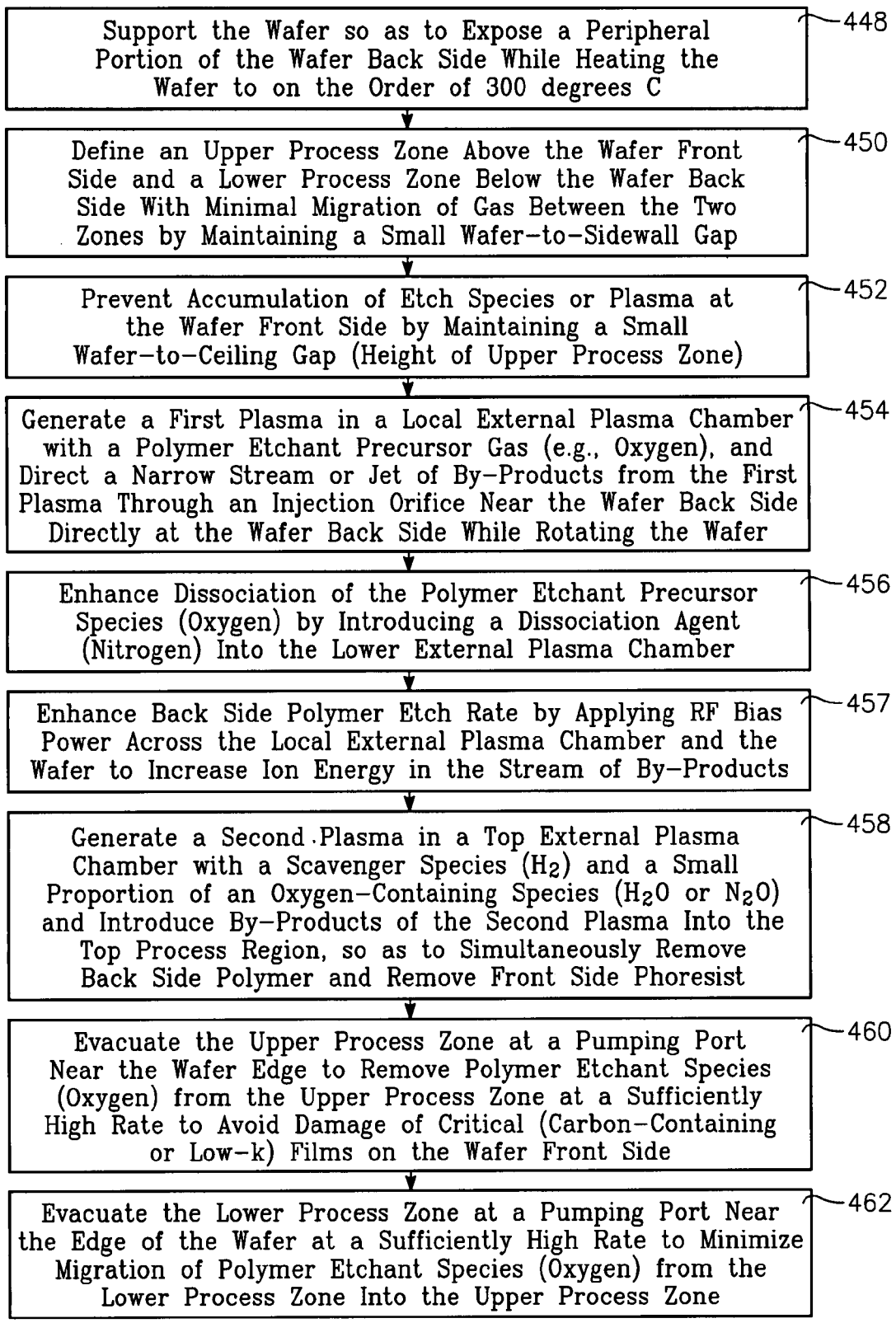
FIG. 9 depicts a backside polymer removal process carried out with the reactor of FIG. 3.

FIG. 9 depicts an exemplary method that can be carried out in the reactor of FIG. 3, in which backside polymer is removed by a concentrated or localized stream of plasma ions, radicals and neutrals from an external plasma source. A first step (block 448) is to support the wafer on the pedestal 112 so as to expose a peripheral portion of the wafer back side while heating the wafer to on the order of 300 degrees C. A next step (block 450) is to define an upper process zone 130 above the wafer front side and a lower process zone 132 below the wafer back side with minimal migration of gas between the two zones by maintaining a wafer-to-sidewall gap at less than 2 mm. A further step (block 452) is to prevent (or minimize) flow or delivery rate of etch species or plasma at the wafer front side by maintaining a wafer-to-ceiling gap (the height of the upper process zone) at less than 2 mm. A further step (block 454) is to generate a first plasma in a local external plasma chamber 300 with a polymer etchant precursor gas (e.g., oxygen), and direct a narrow stream of by-products from the first plasma through an injection orifice 302 near the wafer backside directly at the wafer back side, while rotating the wafer. A related step (block 456) is to enhance dissociation of the polymer etchant precursor species (oxygen) by introducing a dissociation agent (nitrogen gas) into the local external plasma chamber 300. Another related step (block 457) is to enhance the backside polymer etch rate by applying RF bias power across the local external plasma chamber and the wafer. Another step (block 458) is to generate a second plasma in an upper external plasma source 200 with a scavenger species (H2 or N2) that scavenges the polymer etch species, and introduce by-products of the second plasma (H radicals or N radicals) into the upper process zone 130. Another step (block 460) is to evacuate the upper process zone 130 at a pumping port 212 near the wafer edge to remove polymer etchant species (oxygen) from the upper process zone at a sufficiently high rate to avoid damage of critical (carbon-containing or low-k) films on the wafer front side. A related step (block 462) is to evacuate the lower process zone 132 at a pumping port 218 near the edge of the wafer at a sufficiently high-rate to minimize migration of polymer etchant species (oxygen) from the lower process zone 132 the into the upper process zone 130.

Figure 10:
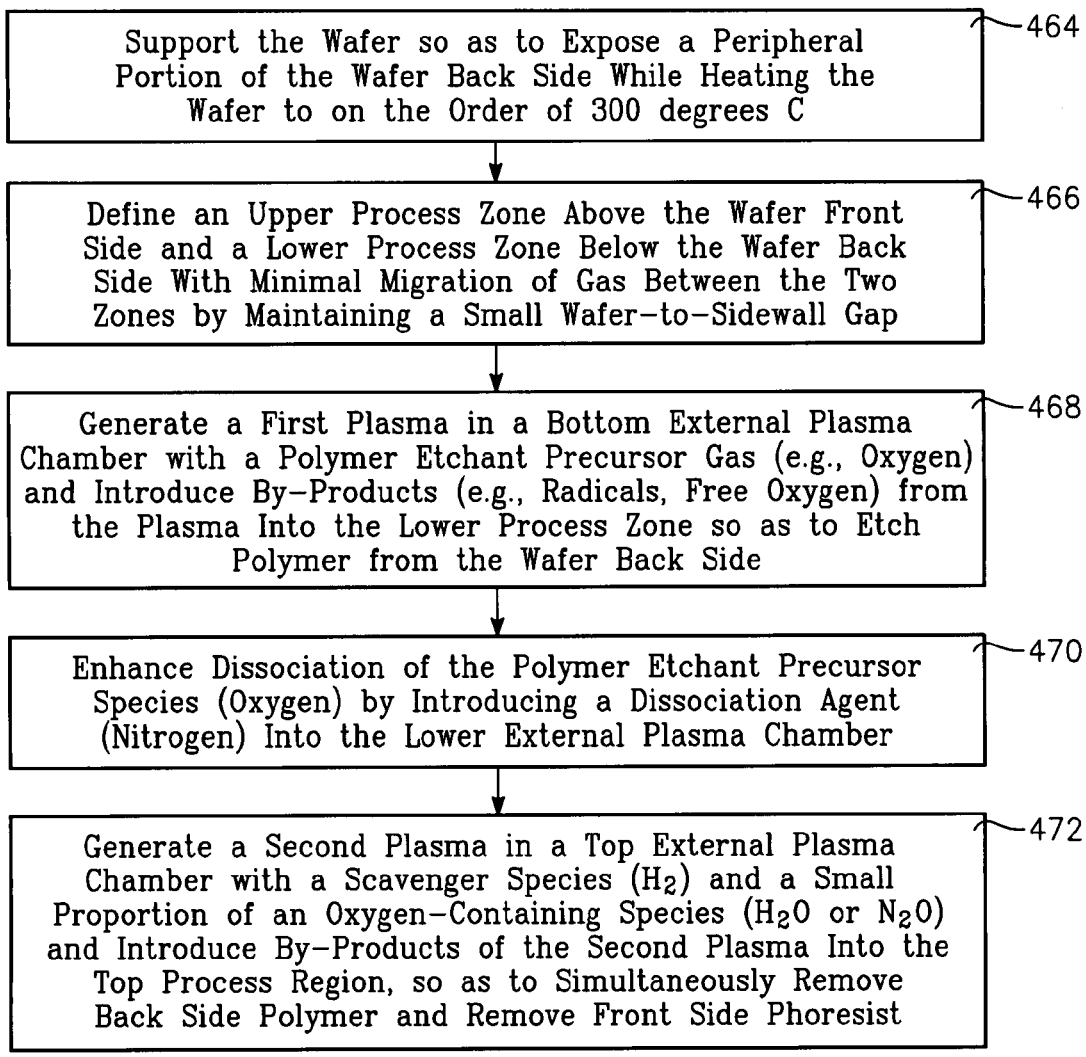
FIG. 10 depicts an alternative process carried out in the reactor of FIG. 2 for simultaneously removing backside polymer and removing front side photoresist from the wafer.

FIG. 10 depicts an exemplary process carried out in the reactor of FIG. 2 for simultaneously removing polymer from the wafer backside while removing photoresist from the wafer front side. The process of FIG. 10 may be carried out, for example, in cases in which there is no film on the wafer front side (such as a ULK film) that is particularly susceptible to damage from polymer etchant species, or in cases in which any critical or ULK films that are present can tolerate the limited flow of polymer etch species escaping from the lower process zone 132 to the upper process zone 130. A first step (block 464) is to support the wafer so as to expose a peripheral portion of the wafer back side while heating the wafer to on the order of 300 degrees C. A next step (block 466) is to define an upper process zone 130 above the wafer front side and a lower process zone 132 below the wafer back side with minimal migration of gas between the two zones by maintaining a wafer-to-sidewall gap at less than 2 mm. A further step (block 468) is to generate a first plasma in a lower external plasma chamber 134 with a polymer etchant precursor gas (e.g., oxygen), and introduce by-products (e.g., radicals, free oxygen) from the plasma into the lower process zone 132 so as to etch polymer from the wafer back side. A related step (block 470) is to enhance dissociation of the polymer etchant precursor species (oxygen) by introducing a dissociation agent (nitrogen gas) into the lower external plasma chamber 134. A step (block 472) carried out simultaneously with the step of block 468 is to generate a second plasma in an upper external plasma chamber 200 with a scavenger precursor gas (H2) and a small proportion of an oxygen-containing species (H2O or N2O). By-products of the second plasma, e.g., scavenger species (H radicals) and oxygen-containing radicals, are introduced into the upper process zone 130. The scavenger species removes etch species (e.g., oxygen) from the upper process zone 130, and, with the help of the oxygen-containing species, removes photoresist from the wafer front side. During this process, it is preferable to maintain the height of the upper process zone 130 in the narrow range (0.2-2 mm) to enhance the rate of photoresist removal. The result of this step is to simultaneously remove backside polymer using the bottom external plasma source 134 and remove front side photoresist with the upper external plasma source 200. The flow rate of the oxygen-containing (H2O or N2O) into the upper external plasma source 200 species may be 1-10% of the hydrogen flow rate into the upper external plasma source 200, for example.

Figure 11:
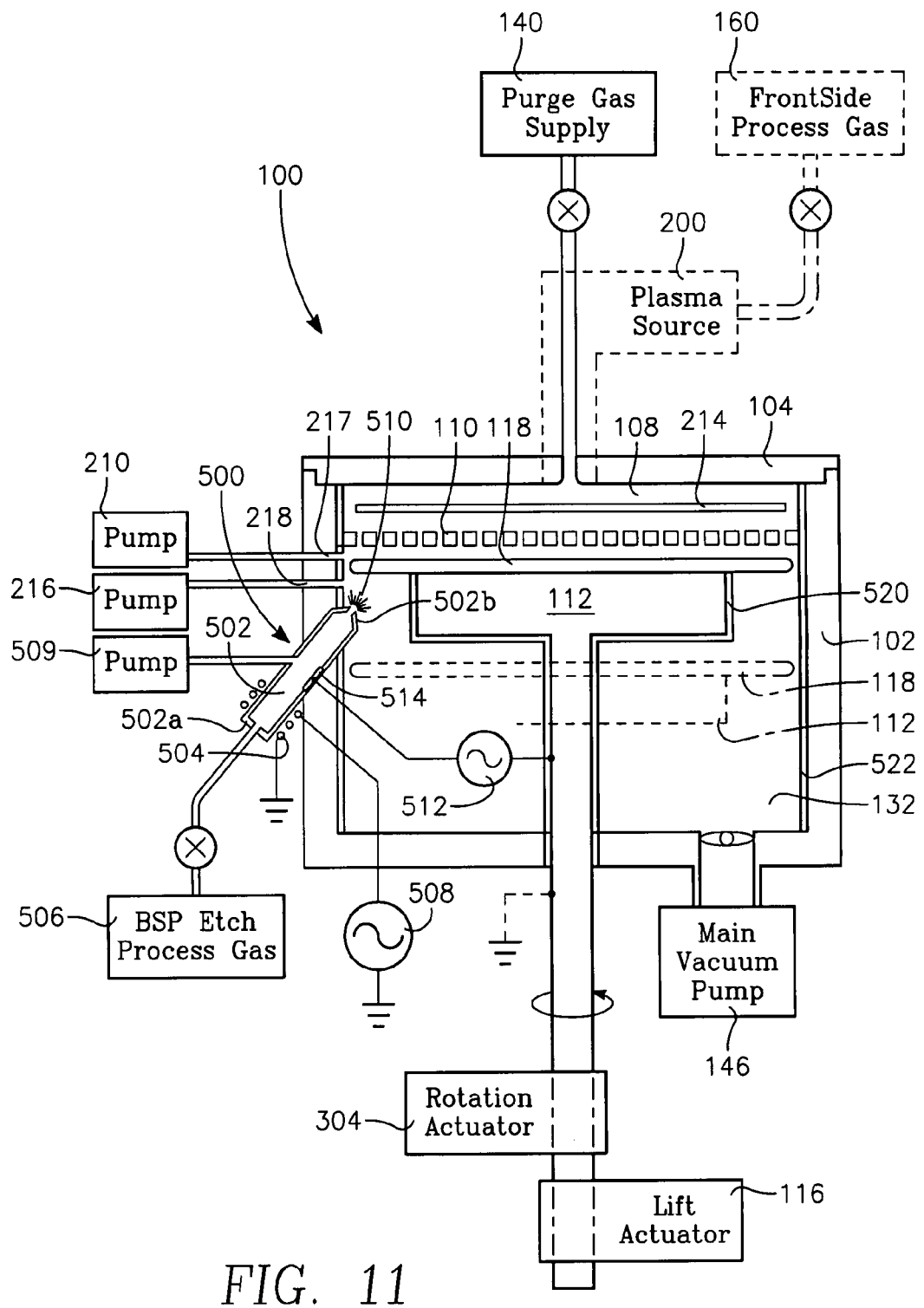
FIG. 11 depicts a modification of the reactor of FIG. 3 in which the external plasma source of the plasma stream is replaced by an internal inductively coupled source.

FIG. 11 depicts a variation of the reactor of FIG. 3, in which the plasma by-product stream or jet directed at the wafer backside edge is produced by components within the reactor itself rather than an external plasma source. For this purpose, an external plasma source such as the external plasma source 300 shown in FIG. 3 is replaced in the embodiment of FIG. 11 by an internal plasma source 500 consisting of a cylindrical sealed enclosure 502, which may be formed of an insulating material such as quartz, and a coil 504 wrapped around a portion of the cylindrical enclosure 502. In the illustrated reactor, the coil 504 is outside of the chamber. The enclosure 502 is closed at its bottom end 502a and forms a nozzle or conical shaped outlet 502b at its top end facing and close to the backside edge of the wafer 118. A gas supply 506 storing a polymer etch gas species is coupled to the enclosure 502 through the bottom end 502a. An RF generator 508 is coupled to the coil 504 (through an optional impedance match, not shown) and furnishes sufficient power to produce an inductively coupled plasma inside the enclosure 502. The pressure inside the enclosure 502 is greater than that of the lower process zone 132. This pressure difference may be controlled by the main vacuum pump 146 and an optional vacuum pump 509 coupled to the enclosure 502. Plasma by-products, for example radicals, neutrals and/or ions, escape through the nozzle outlet 502b and form a concentrated or localized stream 510 that impinges upon a target area of the wafer backside edge. In order to control the ion energy of the stream 510, an optional RF bias power generator 512 may be connected between an interior electrode 514 inside the enclosure 502 and the wafer pedestal 112. While the upper external plasma source 200 of FIG. 3 may be employed in the reactor of FIG. 11, this option is depicted in FIG. 11 only in dashed line. Instead, the solid line image of FIG. 11 shows that (optionally) the purge gas supply 140 may furnish purge gases through the ceiling gas distribution plate 104 with no external plasma source. The purge gas may be either non-reactive or may be a reactive scavenger species, as discussed with reference to FIG. 1.

In one embodiment, to provide a desired (e.g., 300 degree C) wafer temperature, the pedestal 112 may be heated as in FIG. 3, or radiant lamps (not shown) above the ceiling may be employed. In one embodiment, a liner 520 of a process-compatible material may cover the side and bottom edge surfaces of the pedestal 112, and a liner 522 of a process compatible material may cover the side wall 102. The liners 520, 522 may be useful in minimizing metal contamination due to etching of chamber surfaces by the plasma stream 510. The process-compatible material may be, for example, quartz. In one implementation, the ceiling 104 may be formed of a process-compatible material such as quartz. In this case, the ceiling may be a smooth simple structure without the gas distribution plate features depicted in FIG. 11.

In an alternative embodiment, the plasma source enclosure 502 of FIG. 11 may be in the shape of a torus, to form a toroidal plasma source.

Figure 12:
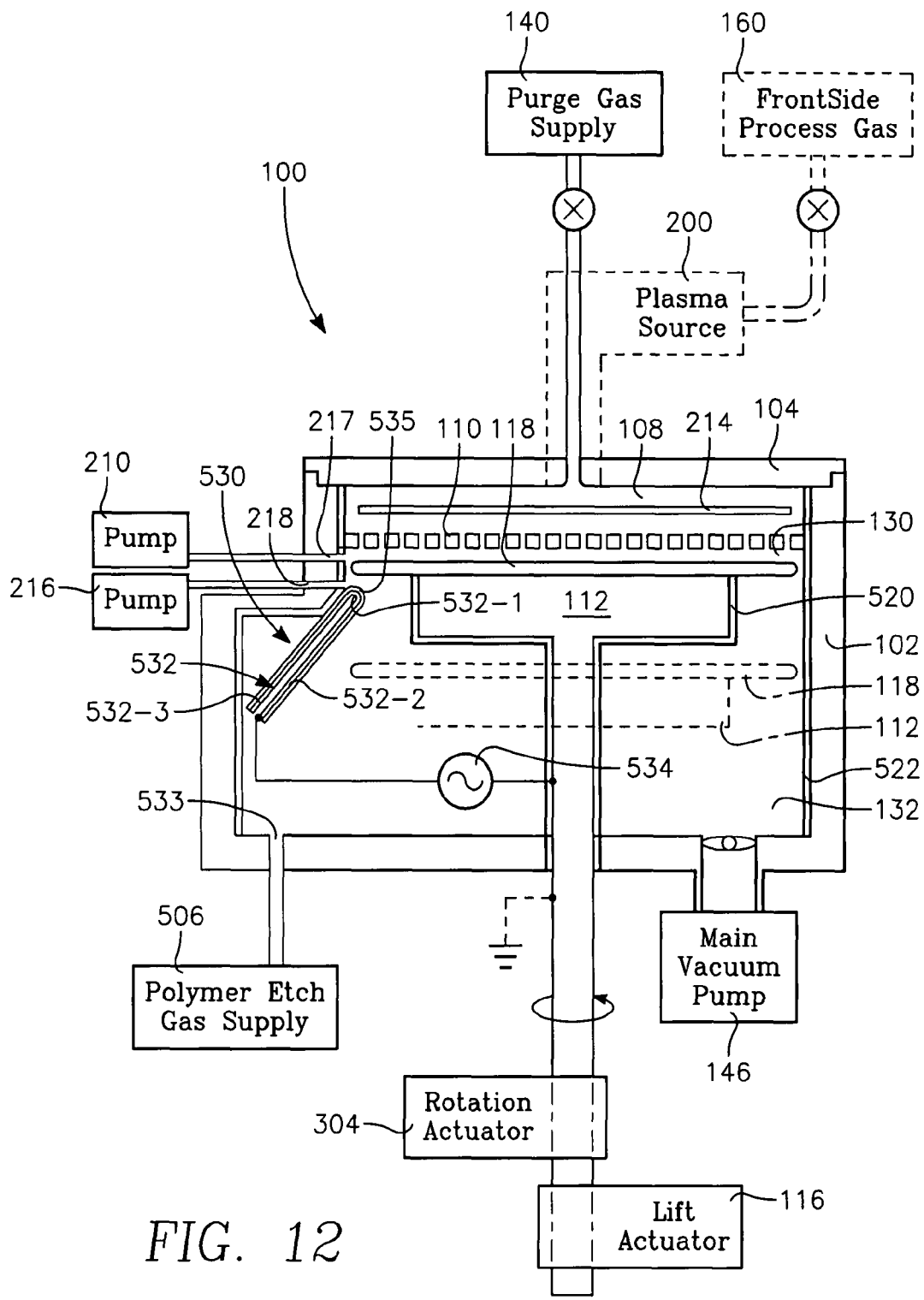
FIG. 12 depicts a modification of the reactor of FIG. 11, in which the internal inductively coupled source is replaced by an internal capacitively coupled source.

In another alternative embodiment, the inductive plasma source 500 (the tube enclosure 502) is replaced by a capacitively coupled source 530 as illustrated in FIG. 12. The capacitively coupled source 530 includes a conductive electrode 532 having a small discharge portion or area 532-1 close to and facing the backside edge of the wafer 118 and at least one axially extending leg 532-2. A polymer etch gas species is introduced into the lower process zone 132 through an opening 533 in the chamber floor from a gas supply 506. An RF generator 534 is coupled between the bottom end of the axially extending leg 532-2 and the wafer pedestal 112. A second axially extending leg 532-3 parallel to the first leg 532-2 may be provided. RF power from the generator 534 produces a plasma discharge in the small gap between the electrode discharge portion 532-1 and a corresponding area on the wafer backside edge. In one embodiment, the side of the electrode 532 facing the wafer 118 (or the entire electrode 532) may be covered by a liner 535, which may be formed of a process-compatible material such as quartz, which is useful in minimizing or preventing metal contamination. As in the embodiment of FIG. 11, the wafer is rotated so that the entire backside edge circumference is exposed to the localized plasma.

If radiant heating is employed to heat the wafer 118, then the pedestal 112 may not be necessary, as will be discussed below.

Figure 13:
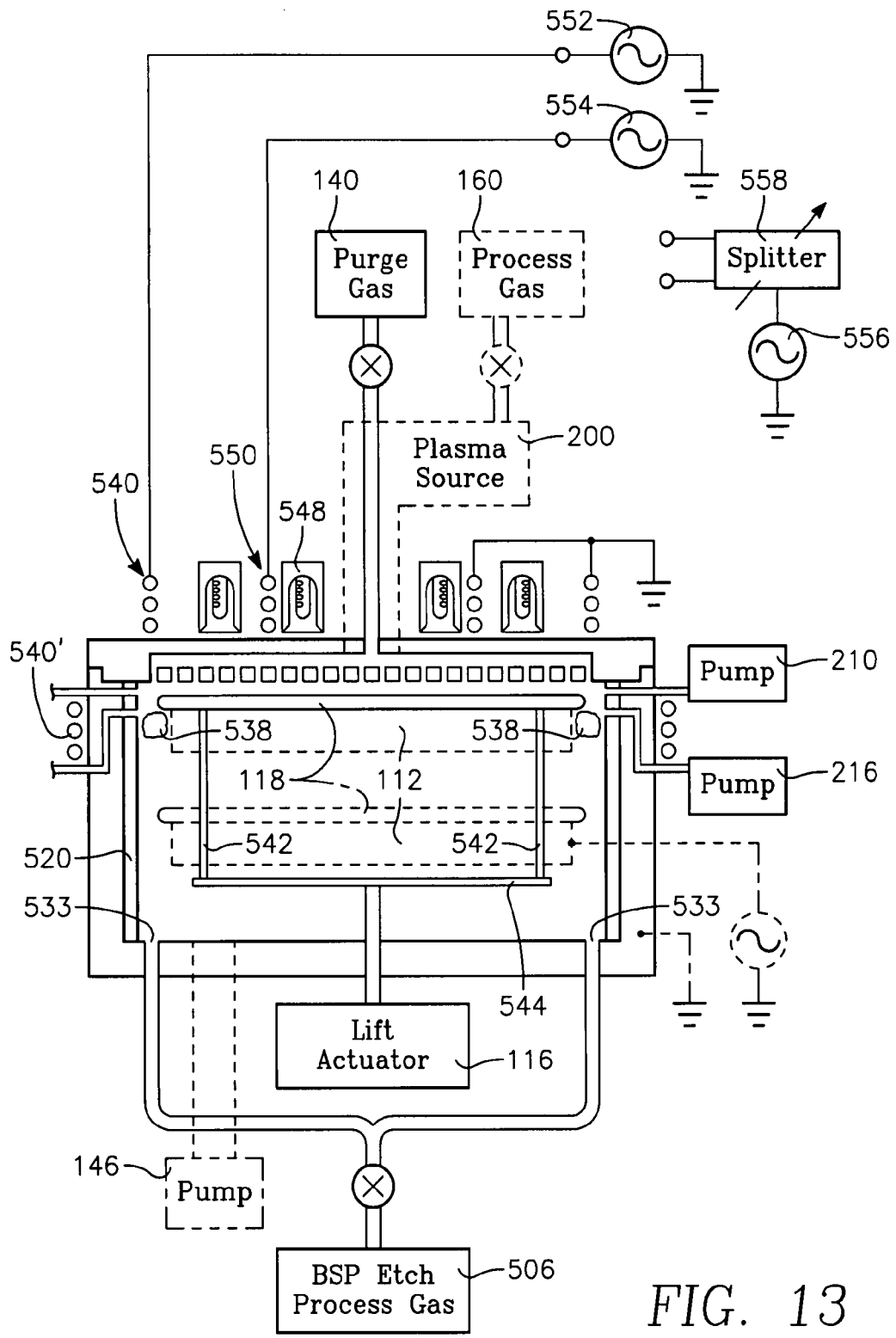
FIG. 13 depicts an alternative approach in which a ring plasma is generated beneath the wafer backside edge by an inductively coupled source.

In the reactor of FIG. 13, the need to rotate the wafer to expose its bottom circumference to a plasma stream is eliminated by instead generating a ring of plasma 538 beneath the backside edge extending around the entire circumference. This is accomplished by placing the wafer 118 very close the ceiling 104, as in the foregoing embodiments, and then applying RF power to a coil antenna 540 overlying the edge of the wafer 118. The coil antenna 540 may consist of solenoidal conductive windings, for example. While the wafer may be held in the elevated position depicted in FIG. 13 with the heated pedestal 112 of FIG. 11, FIG. 13 illustrates how the wafer may be elevated by lift pins 542 suspended on the lift spider 544 controlled by the lift actuator 116. In this case, the wafer is heated by radiant lamps 548 through the ceiling 104. Alternatively, the above-ceiling coil 540 may be replaced by a coil 540' around the sidewall 102.

In certain embodiments, photoresist is removed from the wafer front side in a separate process. In such embodiments, the wafer is lowered to the dashed line position of FIG. 13, and gases are introduced through the ceiling gas distribution plate 104 capable of removing photoresist, as discussed previously in this specification. In other embodiments, a second inner coil antenna 550 is provided controlling plasma ion density near the center of the wafer. The presence of the second inner coil antenna 550 also improves uniformity of the photoresist removal. The two coil antennas 540, 550 may be driven at independently adjusted RF power levels, to permit tuning of the plasma ion density radial distribution. This may be accomplished by providing separate RF generators 552, 554 coupled to the separate coil antennas 540, 550, or by providing a single RF generator 556 whose power is controllably apportioned between the two antennas 540, 550 by a power splitter 558. The lamp heaters 548 are placed in open spaces over the ceiling between the inner and outer coil antennas 540, 550.

The heated pedestal 112 of FIG. 11 can be used to hold the wafer 118 in the elevated position of FIG. 13. In this case, for a low chamber pressure and in the absence of radiant lamp heaters, efficient heat transfer requires the use of an electrostatic chuck on the pedestal 112. An advantage of using the wafer support pedestal is that it enables bias power to be applied to the wafer in a highly uniform manner while at the same time effecting uniform heating or temperature control of the wafer. A liner 520 can also be provided having process-compatible materials to avoid metal contamination and excessive consumption of pedestal materials during plasma processing.

An advantage of using the radiant lamps 548 to heat the wafer is faster heat transfer (compared to a heated pedestal) in the case of a low chamber pressure where heat conduction or convection is poor.

Figure 14:
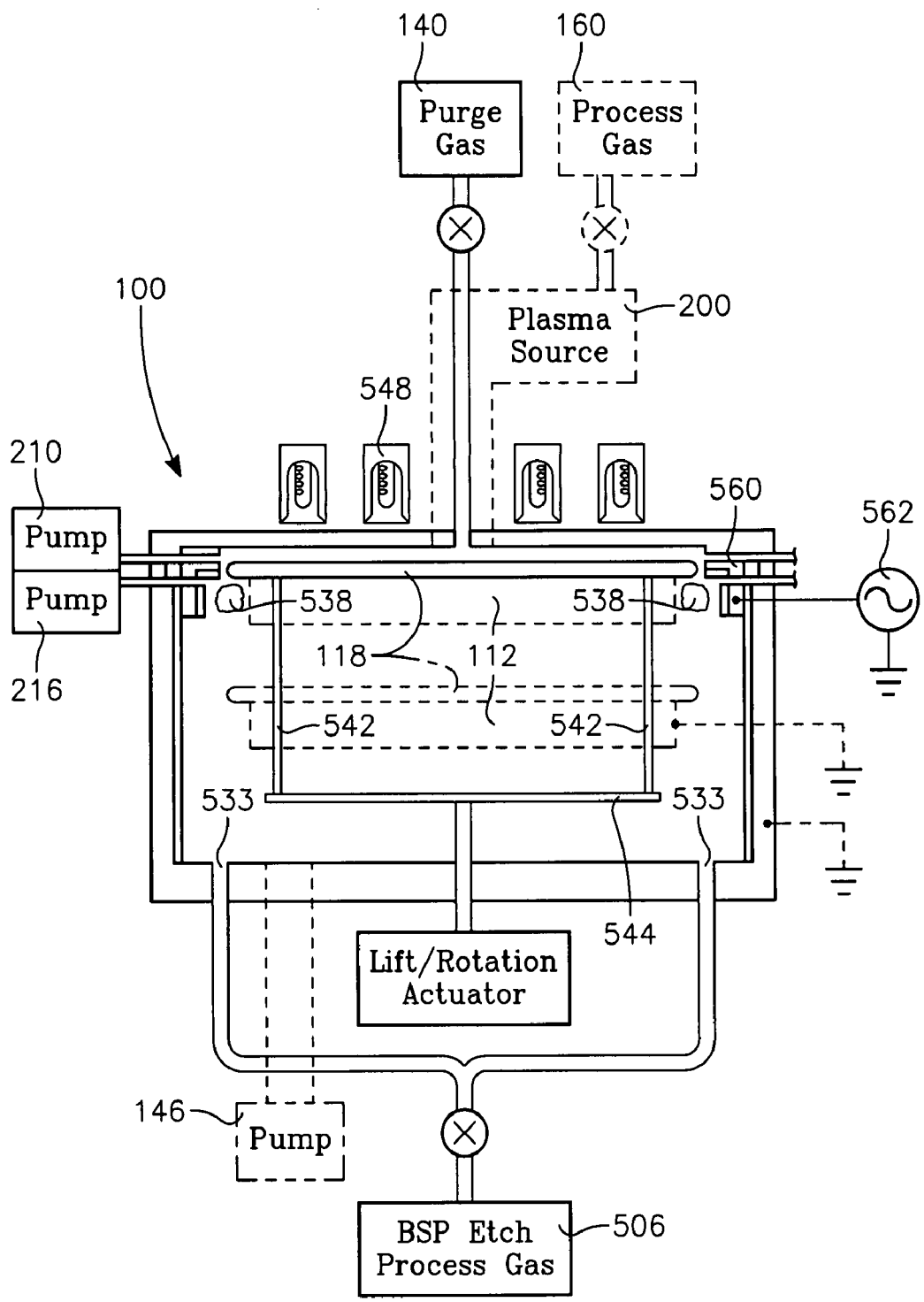
FIG. 14 depicts a modification of the reactor of FIG. 13 in which the inductively coupled source is replaced by an internal capacitively coupled source electrode for generating the ring plasma.
Figure 15:
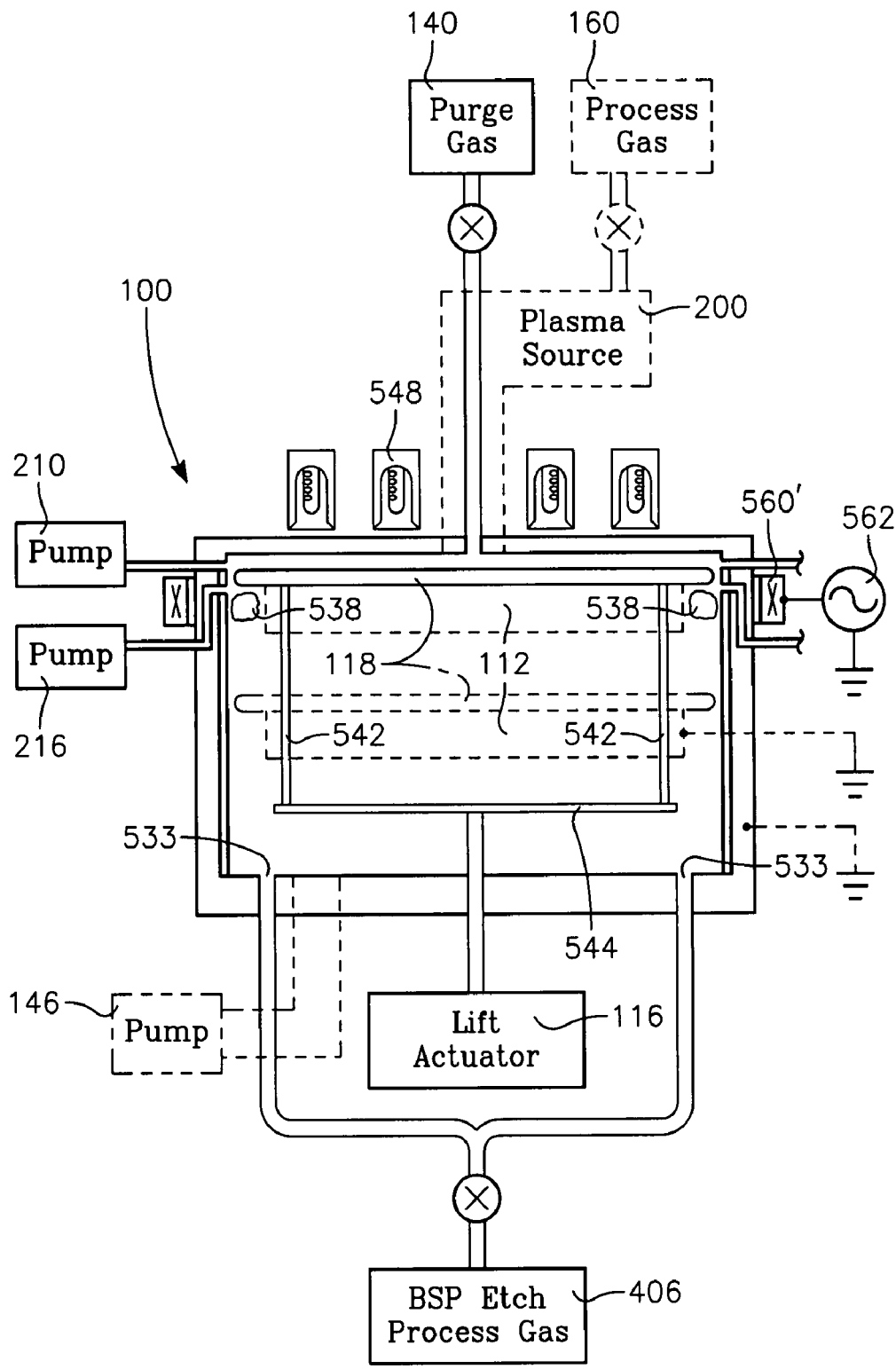
FIG. 15 depicts a modification of the reactor of FIG. 14 in which the internal capacitively coupled source electrode is replaced by an external capacitively coupled source electrode.

FIG. 14 depicts another embodiment of the reactor of FIG. 13 in which the coil antenna 540 for generating a ring plasma is replaced by a ring electrode 560 surrounding the wafer edge, and an RF generator 562 coupled to the ring electrode 560. RF discharge from the ring electrode 560 produces the ring plasma 538 by capacitive coupling. FIG. 15 depicts a modification of the reactor of FIG. 14 in which a ring electrode 560' is outside of the chamber 100.

Figure 16:
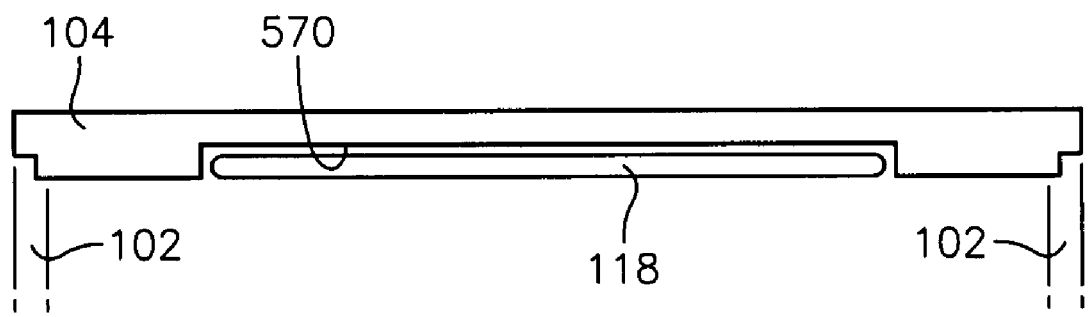
FIG. 16 depicts a feature of the ceiling for shielding the wafer front side during backside polymer removal.

FIG. 16 depicts a modification that can be implemented in any of the reactors described herein, in which the ceiling 104 has a shallow cylindrical hollow 570 corresponding to the volume of the wafer 118. In certain embodiments, the wafer can be lifted into the hollow 570 to effectively shield the wafer front side from polymer etch gases during the backside polymer removal process.

Figure 17:
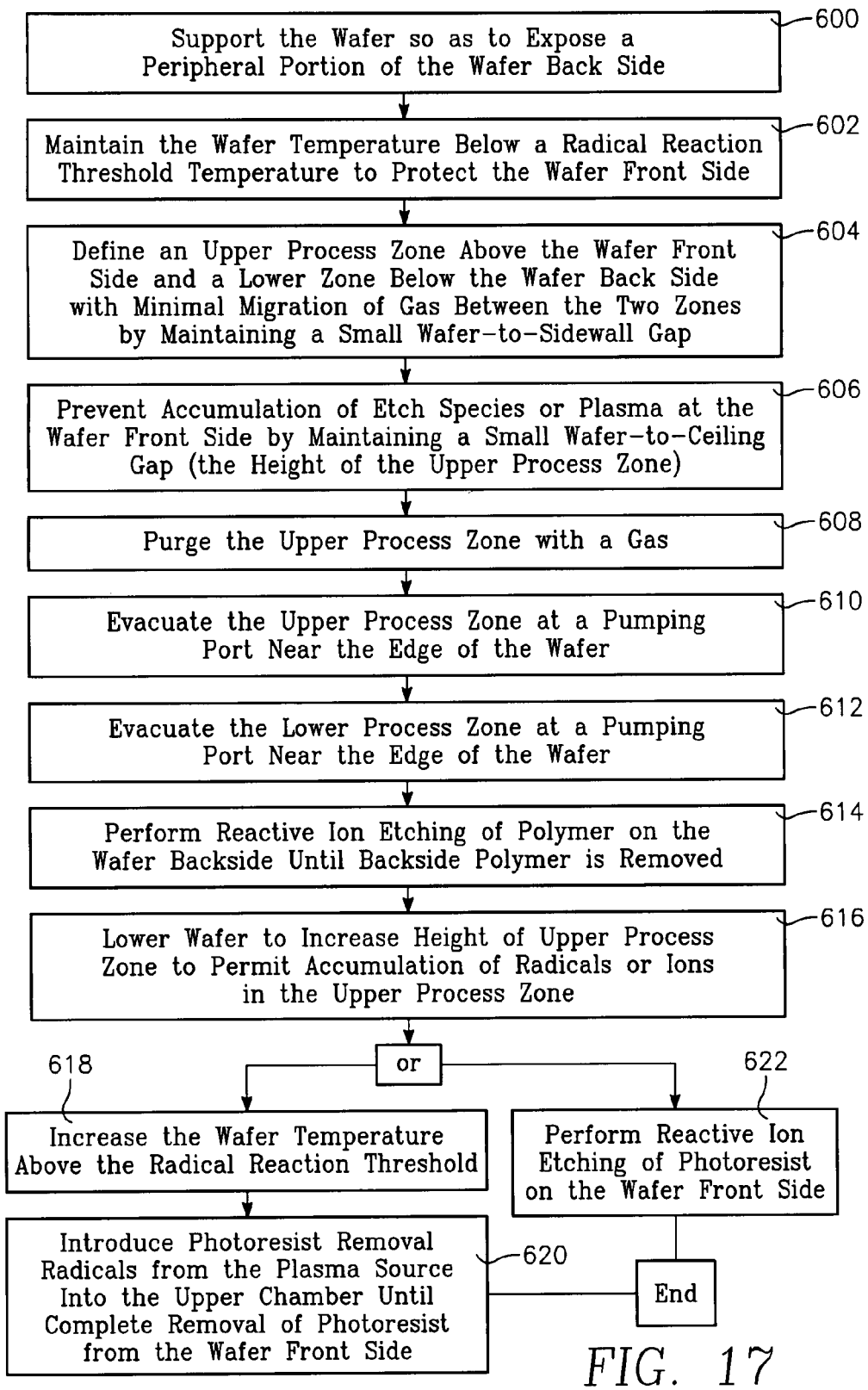
FIG. 17 is a block diagram of a process for backside polymer removal and front side photoresist strip involving temperature switching.

FIG. 17 illustrates a process in which the reactor chamber is used to perform reactive ion etch of polymer from the wafer backside in a raised wafer position and then photoresist stripping on the wafer front side in a lowered wafer position. Temperature switching is employed to enhance wafer front side protection. Specifically, backside polymer removal is performed at a low wafer temperature and then front side photoresist strip is performed at a high wafer temperature (the order may be reversed). The backside polymer reactive ion etch step may be performed at a sufficiently low wafer temperature to retard the reaction of its by-products (radicals) with thin films (e.g., photoresist) on the wafer front side. If the front side photoresist strip process uses radicals from a remote source, it is facilitated by raising the wafer temperature to a threshold at which the reaction rate of the radicals with photoresist is significantly increased. If the front side photoresist strip process is a reactive ion etch process, then the wafer temperature does not necessarily have to be increased for this step.

Referring now to an exemplary process shown in FIG. 17, a first step (block 600) is to support the wafer on the pedestal so as to expose a peripheral portion of the wafer back side. The wafer temperature is set under a threshold temperature (e.g., under 200 degrees C) below which the reaction rate of polymer etch species radicals with wafer thin film materials is significantly retarded (block 602). A next step (block 604) is to define an upper process zone above the wafer front side and a lower process zone below the wafer back side with minimal migration of gas between the two zones by maintaining a wafer-to-sidewall gap at less than 2 mm. A further step (block 606) is to prevent accumulation of etch species or plasma at the wafer front side by maintaining a wafer-to-ceiling gap (the height of the upper process zone) at less than 2 mm. Another step (block 608) is to purge the upper process zone to remove any etch species radicals that may leak through the wafer-sidewall gap. In order to reduce or avoid etching of thin films on the wafer front side, a further step (block 610) is to evacuate the upper process zone at a pumping port near the wafer edge to remove polymer etchant species (oxygen) from the upper process zone at a sufficiently high rate to avoid damage of critical (carbon-containing or low-k) films on the wafer front side. A related step (block 612) is to evacuate the lower process zone at a pumping port near the edge of the wafer. Reactive ion etching of the polymer on the wafer backside is performed with a plasma close to the wafer backside edge (block 614), until the backside polymer is completely removed. Application of plasma to the wafer backside is then stopped, and the wafer is lowered to increase the height of the upper process zone, in order to permit accumulation of plasma or radicals in the upper process zone (block 616). Then, the wafer temperature is increased above a higher threshold temperature (e.g., above 300 degrees C) in order to significantly increase the reaction rate of the radicals with photoresist on the wafer front side (block 618). Typically, the reaction rate increase corresponding to the temperature increase from the lower threshold temperature to the higher threshold temperature is about a factor of 5. Radicals from a remote plasma source are employed to strip the front side photoresist (block 620). Alternatively, the step (block 618) of raising the wafer temperature may be omitted, and a reactive ion etch process is used to strip the photoresist (block 622).

Figure 18:
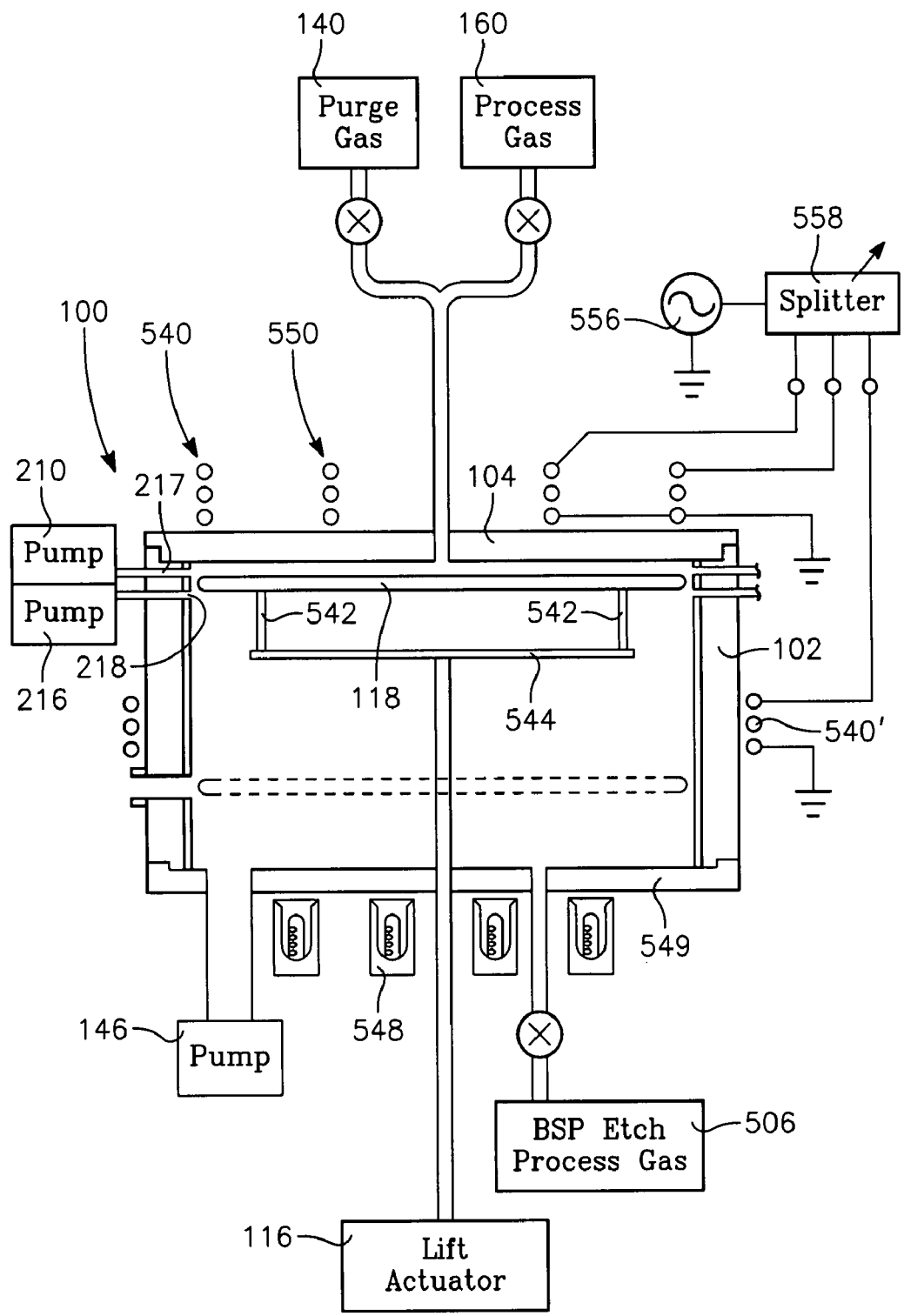
FIG. 18 illustrates a first reactor adapted to perform the process of FIG. 17.

FIG. 18 depicts a modification of the plasma reactor of FIG. 13 that is capable of performing the process of FIG. 17. In this modification, a front side (e.g., photoresist strip) process gas supply 160 is provided in addition to the purge gas supply 140 through the ceiling 104. The outer coil 540' is moved to an axial location below the wafer plane. Optionally, the heater lamps 548 are moved from the ceiling to the floor at the bottom of the chamber. The heater lamps 548 of FIG. 18 may be employed in carrying out the wafer temperature control step of block 602 of FIG. 17. A quartz window 549 is provided in the floor for the heat lamps 548. The small wafer-ceiling gap of block 606 of FIG. 17 is realized at the raised (solid line) position of the wafer in the reactor of FIG. 18. The purge gas supply 140 of FIG. 18 provides the gas for the purge step of block 608 of FIG. 17. The pumping ports 217 and 218 of FIG. 18 are used in the steps of blocks 610 and 612 of FIG. 17. The reactive ion etch step of block 614 of FIG. 17 is carried out by the splitter 558 of FIG. 18 applying RF power only to the outer coil 540'. This creates a ring of plasma beneath the backside wafer edge, as described previously with reference to FIG. 13, to remove the backside polymer. Upon completion of this step, the wafer 118 is lowered to the dashed line position of FIG. 18, and process gas (e.g., a photoresist strip process gas) is introduced through the ceiling 104 from the gas supply 160 and into now enlarged upper process zone. The splitter 558 applies RF power to both the inner and outer coils 540, 550, with power being apportioned between the two coils to optimize plasma ion uniformity over the front side of the wafer. The RF power and gas flow is maintained until the completion of the reactive ion photoresist etch step of block 622 of FIG. 17.

Figure 19:
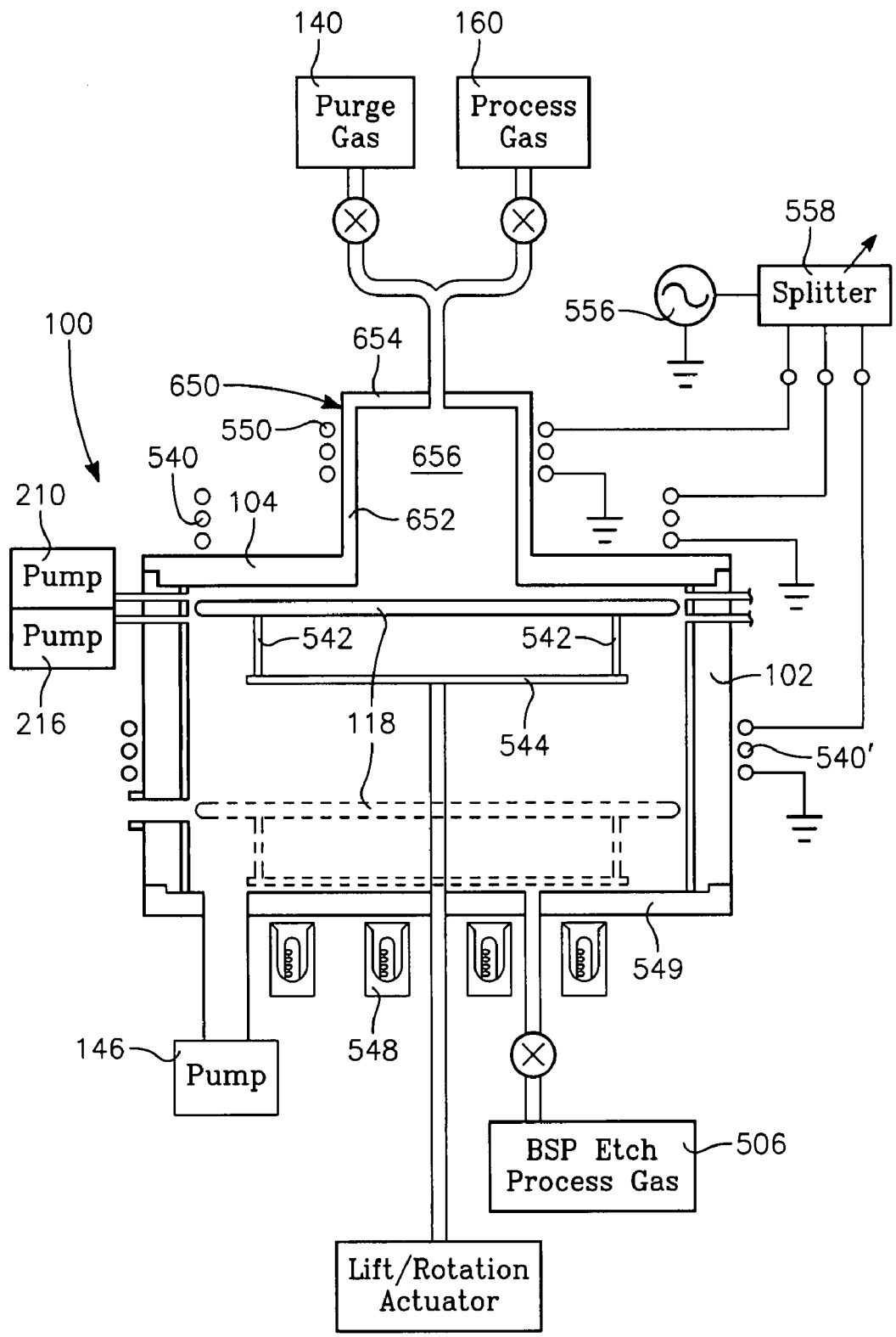
FIG. 19 illustrates a second reactor adapted to perform the process of FIG. 19.

FIG. 19 depicts a modification of the embodiment of FIG. 18, in which the ceiling 104 is modified to form an upward extending neck 650 having a cylindrical side wall 652 and a neck cap 654, forming a neck volume 656. The outputs from the purge gas supply 140 and the process gas supply 160 are received in the neck volume. The inner coil 550 is wound around the neck sidewall 652, so that the neck volume 656 functions as the chamber of a remote plasma source. The splitter 558 of FIG. 19 applies power only to the outer coil 540 during the backside etch process to form a ring of plasma beneath the wafer backside edge. The splitter 558 applies power only to the inner coil 550 during the front side etch process to provide a remote plasma source. Because of the distance of the remote source chamber 656 from the wafer 118 in its lowered (dashed line) position of FIG. 19, ions from the plasma in the neck recombine before reaching the wafer 118, and therefore the front side etch is a radical-based process, in accordance with the step of block 620 of FIG. 17. This makes it advantageous to use the heater lamps 548 of FIG. 19 prior to this step to increase the wafer temperature above the radical reaction threshold temperature, in accordance with block 618 of FIG. 17.

The reactor of FIG. 11 may be adapted to perform the process of FIG. 17 by adding a remote plasma source 200 and its process gas supply. The remote plasma source 200 may be implemented with a coil wrapped around a neck or tube (as shown in FIG. 19) or it may be any other type of plasma source, such as a microwave plasma source, for example. The wafer pedestal 112 of FIG. 11 may control the wafer temperature in accordance with the process of FIG. 17, and the pedestal 112 may move between the raised and lowered (dashed-line) positions of FIG. 11, as an optional feature of the process of FIG. 17. The reactor of FIG. 12 is modified in the same manner to adapt it to perform the process of FIG. 17, by adding the remote plasma source 200 at the ceiling of the reactor of FIG. 12, and moving the pedestal 112 between the solid and dashed-line positions of FIG. 12. The same modifications may carried out in each one of the reactors of FIGS. 13, 14 and 15. Each one of FIGS. 13, 14 and 15 shows that, while lift pins may be employed to control the wafer position, a movable heated pedestal 112 (partially shown in dashed line in both its elevated and retracted positions) may be employed instead, in which case the heater lamps 548 would not be required. In each of the reactors of FIGS. 11-15, the optional use of a wafer pedestal 112 enables bias power to be applied to the wafer. Advantages of this feature include the enhancement of the backside polymer etch process, and the suppression of ions in the upper process zone 130 if the wafer-ceiling gap is less than the plasma sheath thickness.

Reactive ion etching for removal of backside polymer from the wafer can be accomplished in the process of FIG. 9 using the reactor of FIG. 3. In this aspect, the backside plasma source 300 of FIG. 3 produces a sufficient flow of ions that reach the wafer backside. This condition is realized by holding the chamber pressure of the external plasma source 300 to a low pressure. In this step, the wafer temperature is held under a low threshold temperature (e.g. below about 200 degrees C. below which the reaction rate of polymer etch radicals with wafer front side thin film materials is very slow (e.g., about 5 times slower than at about 300 degrees C). The reactive ion etch process used to remove the backside polymer is not hampered at low wafer temperatures. Therefore, this low wafer temperature does not prevent the polymer etch ions from reacting with the backside polymer, but it does effectively slow down the reaction rate of polymer etch radicals that may escape from the lower process zone 132 into the upper process zone 130 with the wafer front side materials. The small wafer-to-ceiling gap employed during the backside polymer removal step essentially guarantees that most (or all) of the polymer etch species that can survive in the upper process zone 130 are radicals or neutrals, not ions.

During the front side photoresist strip step of FIG. 7, in which there are no polymer etch species threatening the wafer front side, the wafer temperature is raised above a high threshold temperature (e.g., above 300 degrees C) at which radicals can react at a faster rate with front side thin film materials, such as photoresist (e.g., at a rate about 5 times faster than at the lower threshold temperature of 200 degrees C). Typically, the wafer temperature is constantly ramping. If the wafer is being heated to ramp its temperature upwardly, then the backside polymer removal step is performed prior to the wafer temperature exceeding the lower threshold temperature, and the front side photoresist strip step is not performed until after the wafer temperature has reached or exceeded the higher threshold temperature. For example, the wafer temperature may begin slightly above room temperature, ramps upwardly during the entire process. In the period before the temperature exceeds about 150 degrees C. or 200 degrees C, the backside polymer removal step is performed and halted upon completion. Then, after a pause to allow the wafer temperature to reach or at least get near 300 degrees C, the front side photoresist step is performed. The processes of FIGS. 7 and 9 may be performed in any order, an advantage being that they are performed in the same reactor without having to remove the wafer. When lowering the wafer as required in the process of FIG. 7, the backside plasma source (300 of FIG. 3 for example) is moved so as not to obstruct wafer movement.

The reactor of FIG. 3 may be modified by replacing the external plasma source 300 with an internal plasma source, such as the internal inductive source 500, 502, 508 of FIG. 11 or the internal capacitive source 530, 532, 534 of FIG. 12. In this case, As previously described in detail in this specification, wafer front side protection is provided by establishing the narrow wafer-ceiling gap and pumping a purge or scavenger gas through that narrow gap. Such protection is improved upon by the feature of holding the wafer temperature below the threshold temperature during backside polymer removal.

Typically, polymer etch radicals (in the absence of ions) react very slowly with photoresist below the low threshold temperature of about 200 degrees C, while a higher reaction rate is obtained above a high threshold temperature of about 300 degrees C. The polymer etch rate increases by about a factor of 5 as the wafer temperature increases from the low threshold temperature (e.g., 300 degrees C) and the high threshold temperature (e.g., 200 degrees C). Therefore, wafer front side protection is enhanced by holding the wafer temperature below the low threshold temperature of 200 degrees C. (e.g., at 150 degrees C) during the backside polymer removal process. During the subsequent front side photoresist stripping, the wafer temperature is raised to about 300 degrees C.

At a high chamber pressure on the order of a Torr, the heated electrostatic chuck or pedestal 112 of FIG. 3 may be employed to control the wafer temperature. One advantage of this is that RF plasma bias power may be applied to the wafer to enhance processing. A possible disadvantage of using a heated pedestal 112 is that the pedestal 112 may require a protective liner of a compatible material, such as quartz, alumina or yttria. At a lower chamber pressure, it may be necessary to use radiant lamps in order to attain a requisite heat transfer rate. One advantage of radiant lamps is that the wafer temperature may be switched between the two temperatures more quickly, particularly if the wafer is lifted above contact with the pedestal 112 during processing.

Figure 20:
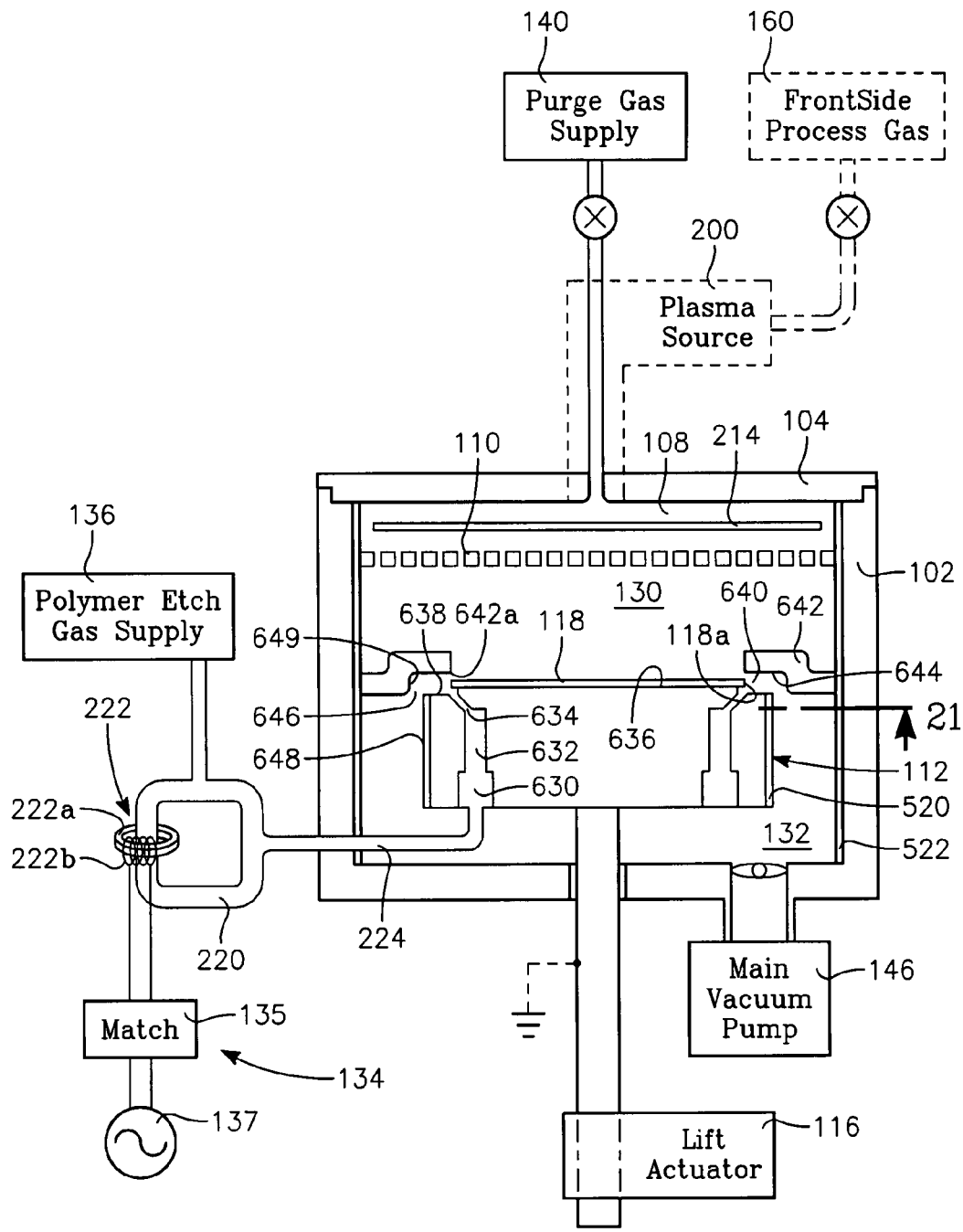
FIGS. 20 and 21 depict a modification of the reactor of FIG. 2.
Figure 21:
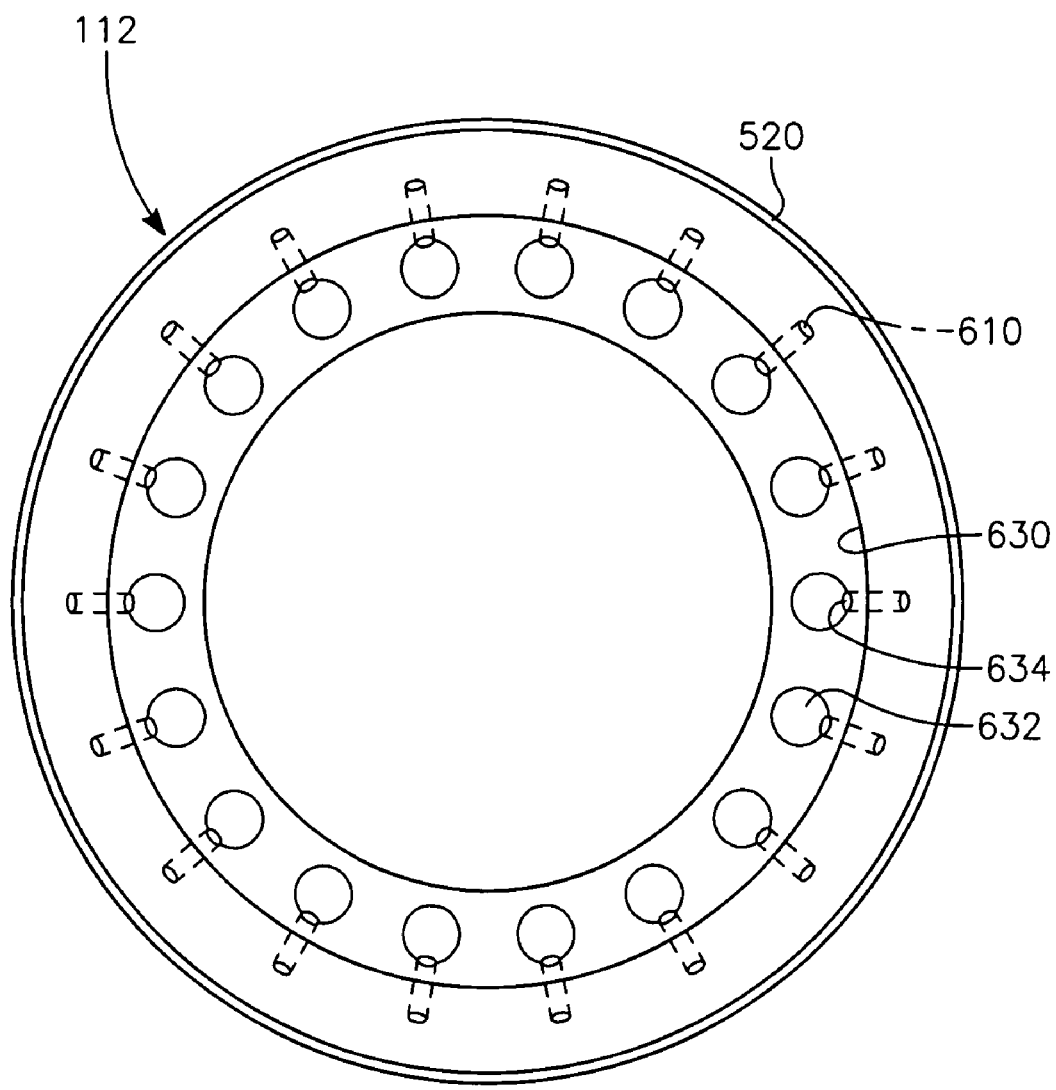

FIG. 20 illustrates a modification of the reactor of FIG. 2 in which the plasma by-products (radicals) from the external plasma source 134 are fed into an annular plenum 630 inside the bottom of the pedestal 112 and upwardly through axial cylindrical bores 632 within the pedestal 112 and is shot out through ejection orifices 634 aimed generally at the peripheral edge of the wafer 118. The annular plenum 630 supplies gas or plasma by-products to the bottom of each bore 632 and the ejection orifices or nozzles 634 receive the plasma by-products from the tops of the bores 632. As shown in FIG. 21, the bores 632 and nozzles 634 are arrayed concentrically. In this way, the flow of plasma by-products from the external plasma source 134 is collimated within internal bores 632 of the pedestal 112 and then aimed as a circular array of directed spray patterns from the ejection orifices 634. The pedestal 112 has a wafer-support surface 636 having a diameter less than that of the wafer 118 so as to leave a peripheral annular region of the wafer backside exposed. The pedestal 112 further has a peripheral annular surface 638 that is parallel to but below the wafer support surface, the height difference between the two surfaces 636, 638 providing a gas flow space 640 between the peripheral annular surface 638 and the wafer backside.

As in the embodiments of FIGS. 1-3, a boundary between the upper and lower process zones 130, 132 is established by constricting gas flow at the peripheral edge of the wafer 118. In the reactor of FIG. 20, this is accomplished by providing a confinement ring 642 surrounding the pedestal 112 and having an inner edge 642a adjacent the edge 118a of the wafer, the two edges 118a, 642a being separated by a small gap of about 0.5-5 mm. This gap is sufficiently small to limit gas flow between the upper and lower process zones 130, 132 and thereby protect the wafer front side during etching of polymer from the wafer backside edge. Evacuation of polymer etch species is performed by the main vacuum pump 146 through a horizontal radial space 640 between the annular peripheral surface 638 of the pedestal and a bottom surface 644 of the ring 642. This evacuation extends through a vertical axial space 646 between the side wall 648 of the pedestal 112 and a vertical surface 649 of the ring 642.

In the implementation depicted in the drawing of FIG. 20, the chamber 220 of the external plasma source 134 is a toroid and the RF source power applicator 222 consists of a magnetically permeable ring 222a wrapped around a section the chamber 220 and a coil 222b wrapped around the ring 222a and driven through an impedance match 135 by an RF source power generator 137. The chamber 220 is coupled to the plenum 630 via a conduit 224.

In the description of the process of FIG. 17 given above, it is stated that the step of block 620, for removing photoresist on the wafer front side, may be carried out using a remote plasma source. This remote plasma source may be the localized plasma source 500 that is also used for backside polymer removal. The localized plasma source 500 can be used for front side photoresist removal by lowering the wafer 118 to the dashed line position of FIG. 11, at which the outflow from the localized plasma source outlet 510 is exposed to the wafer front side. Backside polymer removal is carried out using plasma by-products from the localized plasma source flowing, drifting or diffusing to the wafer backside with the wafer 118 in the raised (solid line) position. Front side photoresist removal is carried out using plasma by-products from the localized plasma source 500 flowing, drifting or diffusing to the wafer front side with the wafer 118 in the lowered (dashed line) position. For process uniformity, the wafer is rotated about the axis of symmetry by the rotation actuator 304 during both the front side photoresist removal and during the backside polymer removal.

When the wafer 118 is in the raised position, the upper process zone 130 is restricted to a shallow region, and the localized plasma source outlet 510 faces the lower process zone 132. When the wafer 118 is in the lowered position, the upper process zone 130 extends below the localized plasma source outlet 510, and so the outlet faces the upper process zone.

Figure 22:
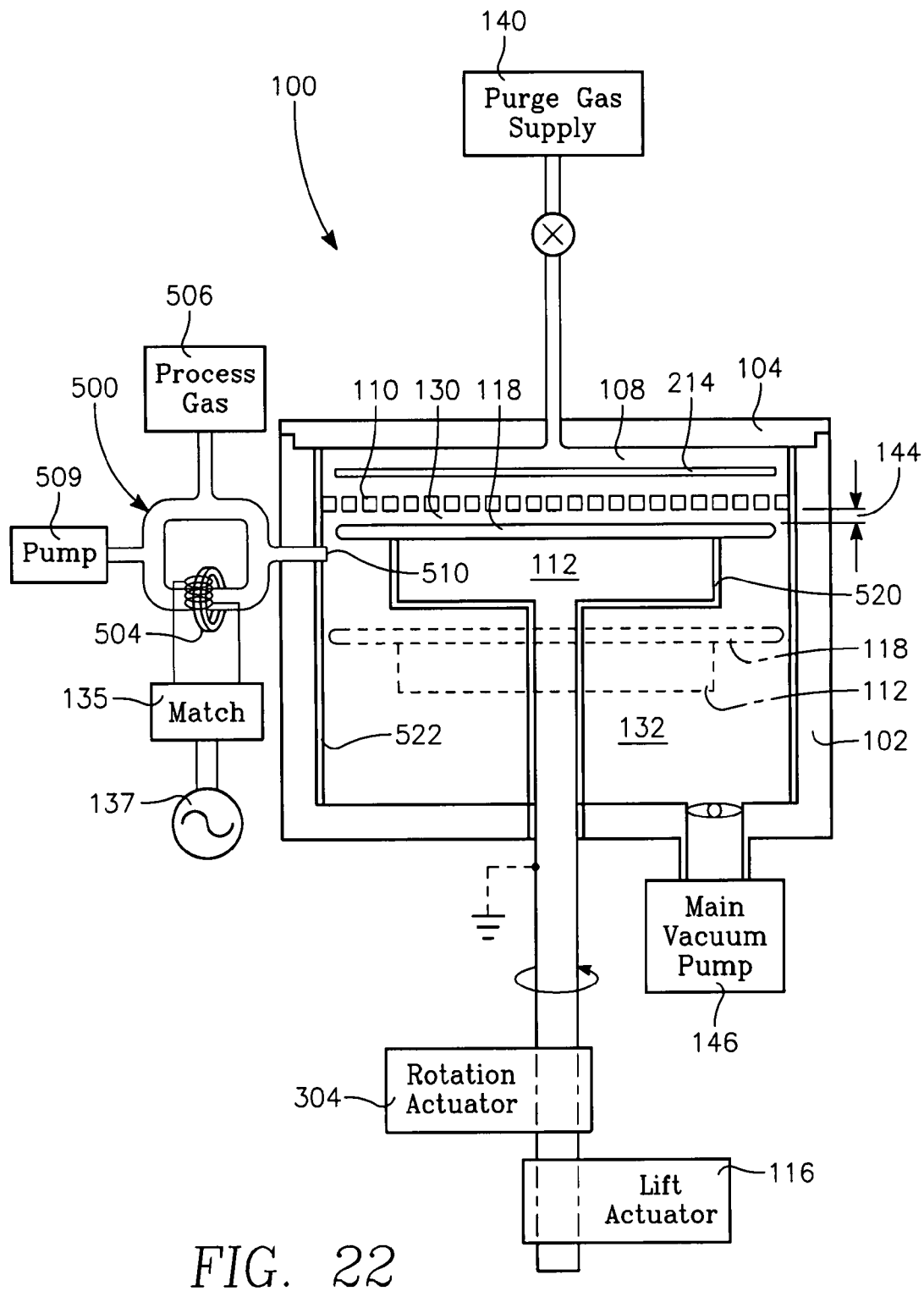
FIG. 22 illustrates a plasma reactor in accordance with a further embodiment.

A modification of the reactor of FIG. 11 that is particularly adapted for this aspect is depicted in FIG. 22. In FIG. 22, the localized plasma source 500 has its outlet 510 facing horizontally, so that it is equally suited for exposing the wafer backside to outflow from the plasma source 500 at the raised wafer position and for exposing the wafer front side to outflow from the plasma source 500 at the lowered wafer position. The outflow from the outlet 510 may not necessarily be a concentrated jet, but rather may be a more diffuse flow. The outflow may consist of any plasma by-products, such as ions, radicals or neutrals. The fraction of ions (if any) in the outflow from the localized plasma source 500 may be controlled with the internal pressure of the localized plasma source 500 and the pressure within the process zone 130. The pressure is controlled by the main vacuum pump 146 and/or an optional pump 509 coupled to the interior of the toroidal source 500. The optional pump 509 may not be present in some embodiments. At a high chamber pressure, the plasma processing would be carried out primarily with radicals. At a lower chamber pressure, the fraction of ions may be higher. In the reactor of FIG. 22, the localized plasma source 500 is depicted as a toroidal plasma source. During front side photoresist removal, uniformity of the photoresist removal rate distribution across the wafer is controlled by controlling (a) the flow rate of plasma by-products from the localized plasma source 500, (b) the flow rate of purge gases from the purge gas supply 140, (c) the wafer-to-ceiling gap, i.e., the height of the upper process zone when the wafer 118 is in the lowered position, and (d) the angular velocity at which the wafer is rotated. The same plasma chemistry or different plasma chemistries or conditions may be used in the localized source 500 during the backside polymer removal (raised wafer position) and during the front side photoresist removal (lowered wafer position). In the raised wafer position, the wafer-ceiling gap is about 0.2-2 mm, while in the lower wafer position the wafer ceiling gap is 1-15 cm, for example. In one embodiment, the wafer support pedestal 112 has heating elements (not illustrated in FIG. 22) for heating the wafer 118.

In the description of FIG. 1 given previously in this specification, the wafer-sidewall gap 122 and the wafer-ceiling gap 144 are both described as being narrow (for the wafer 118 in the raised position). As such, both gaps offer a relatively high gas flow resistance, which is referred to in the description of FIG. 1. However, in the embodiment of FIG. 22, only the wafer-ceiling gap 144 is narrow (e.g., about 0.2-2 mm as described above), the wafer-sidewall gap 122 being widened to provide a greater mechanical tolerance in manufacturing and during wafer handling by the robotic transfer mechanism (not shown). The narrow wafer-ceiling gap 144 is sufficient to prevent or resist the flow of polymer etchant species from the lower process zone 132 to the upper process zone 130 during backside polymer removal, without necessarily requiring the wafer-side wall gap 122 to be narrow. For blocking or resisting flow of polymer etchant species from the lower process zone 132 into the upper process zone, the confinement of the front face of the wafer 118 by a surface parallel to the wafer 118, namely the ceiling 104, is depicted in FIG. 22. However, the confining surface may not necessarily be parallel to the front side of the wafer 118, but may be angled, and may be a diagonal corner at the intersection between the ceiling 104 and side wall 102. A common feature, however, is that the clearance between the confining surface and the wafer surface or the wafer edge or a corner between the wafer surface and edge is sufficiently small (e.g., 0.2-2 mm) to resist gas flow from the lower process zone 132 to the upper process zone 130 when the wafer 118 is in the raised position. Alternatively, the wafer-to-sidewall gap 122 may be selected to be narrow to provide additional resistance to flow of polymer etchant species from the lower process zone 132 to the upper process zone 130 during backside polymer removal.

The localized plasma source 500 is depicted in FIGS. 11 and 22 as having a portion (i.e., the outlet 510) extending through the side wall 102 into the chamber interior and another portion outside of the chamber interior. However, the entire localized plasma source 500 may reside inside the chamber interior (and therefore be an internal remote plasma source) or the entire localized plasma source 500 may reside outside of the chamber while the outlet 510 still communicates with the chamber interior (so that the localized source 500 is an external remote plasma source).

While the pumping port is depicted in the bottom of the chamber, it may alternatively be placed in a sidewall of the chamber. In one embodiment, for optimum across-wafer flow, the pump port is placed on the opposite side wall of the chamber from the localized plasma source.

The localized plasma source 500 may include a conventional gas inlet that injects gas or vapor through the plasma source, and an additional gas inlet that injects gas or vapor at or near the output of the plasma source. In one embodiment, the localized plasma source 500 is a toroidal source made of quartz material or lined with quartz material. For example, oxygen, nitrogen, water vapor, hydrogen or mixtures thereof may be injected through the plasma source. While fluorine-containing gas (eg. NF3 or CF4) may be injected through the plasma source 500, alternatively it may be injected at or near the output 510 of the plasma source while injecting a second gas through the plasma source 500, such as an inert gas such as argon or helium, or a reactive gas such as oxygen, nitrogen, water vapor, hydrogen or mixtures thereof. Injection of the fluorine-containing gas at or near the output 510 of the plasma source while flowing a non-fluorine-containing gas through the plasma source 500 may enable dissociation of the fluorine-containing gas without etching of the plasma source materials. In another embodiment, hydrogen or hydrogen-containing gas may be injected at or near the output 510 of the plasma source 500 while injecting a second gas through the plasma source 500, such as an inert gas such as argon or helium, or a reactive gas such as oxygen, nitrogen, water vapor, hydrogen or mixtures thereof. Injection of the hydrogen-containing gas at or near the output 510 of the plasma source 500 while flowing a non-hydrogen-containing gas, or a mixture that contains oxygen, through the plasma source may enable dissociation of the fluorine-containing gas without etching of the plasma source materials.

While the foregoing is directed to embodiments of the invention, other and further embodiments of the invention may be devised without departing from the basic scope thereof, and the scope thereof is determined by the claims that follow.

What is claimed is:

1. A process for removing polymer from a backside of a workplace comprising:
    supporting said workpiece on the backside in a vacuum chamber while exposing a peripheral annular portion of the backside;
    providing a localized plasma source adjacent a sidewall of the chamber and having an output port contained in said side wall and open to the interior of said chamber;
    confining the front side of said workpiece by holding said workplace in a first position in said chamber above the level of the top of said output port of said localized plasma source removing polymer from the backside of said workpiece, said removing comprising generating a plasma containing polymer etch species in the localized, plasma source, and flowing, drifting or diffusing first plasma by-products through said output port; and
    placing said workpiece in a second position below the level of the bottom of said output port of said localized plasma source; and
    stripping photoresist from a front side of the workplace, said stripping comprising generating a plasma containing photoresist removal species in said localized plasma source, and flowing, drifting or diffusing second plasma by-products from said localized plasma source through said output port.

2. The process of claim 1 further comprising applying a radio frequency (RF) bias between plasma in said localized plasma source and said workpiece.

3. The process of claim 1 wherein said confining and removing are performed one of:
    (a) before, or
    (b) after
said placing and stripping.

4. The process of claim 1 wherein said removing polymer from the backside is carried out while said workpiece is at a temperature below 200 degrees C. and said removing photoresist from the front side is carried out while said workpiece is at a temperature above 300 degrees C.

5. The process of claim 1 wherein said generating a plasma in said localized plasma source comprises one of: (a) inductively coupling plasma source power into said localize plasma source, (b) capacitively coupling plasma source power into said localized plasma source, or (c) generating a toroidal plasma in said localized plasma source.

6. The process of claim 1 wherein said first and second plasma by-products comprise at least one of: ions, neutrals, radicals.

7. The process of claim 1 wherein flowing first plasma by-products through said, output port of said localized plasma source comprises one of: (a) creating a diffusive flow of said first plasma by-products, or (b) creating a concentrated jet stream of said first plasma by-products.

8. The process of claim 1 wherein the same plasma chemistry is present in said localized plasma source during removal of backside polymer and front side photoresist.

9. The process of claim 1 wherein flowing, drifting or diffusing the second plasma by-products comprises directing said second plasma by-products from said output port of said localized plasma source to a target zone of the front side while rotating the workpiece.

10. The process of claim 9 wherein:
    said first position corresponds to a reduced workpiece-ceiling gap and said second position corresponds to a large workpiece-ceiling gap;
    said reduced workpiece-ceiling gap is between about 0.5 mm and 5 mm during the removal of the backside polymer; and
    said large workpiece-ceiling gap is between about 1 cm and 15 cm during the stripping of the photoresist.

11. The process of claim 1 further comprising:
    during said removing of polymer from the workpiece backside, removing polymer etch species from an upper process zone, said upper process zone comprising a volume in said vacuum chamber adjacent said front side or said workpiece.

12. The process of claim 11 wherein the removing of polymer etch species from said upper process zone comprises flowing a purge gas into said upper process zone while evacuating said vacuum chamber.

13. The process of claim 1 further comprising constantly heating said workpiece so as to ramp the temperature of said workpiece.

14. The process of claim 13 wherein said holding and removing are performed prior to said placing and stripping, whereby the stripping of photoresist from the workplace front side is performed at a higher workpiece temperature than removing of polymer from the workpiece backside.

15. The process of claim 1 wherein flowing, drifting or diffusing the first plasma by-products comprises directing said first plasma by-products from said output port of said localized plasma source to a target zone of the backside while rotating the workpiece.

16. The process of claim 15 further comprising, during said stripping photoresist:
  flowing a non-reactive species gas through a ceiling of said chamber into said upper process zone; and
  adjusting the uniformity of photoresist removal rate by adjusting: (a) a flow rate of said non-reactive species gas, (b) a flow rate of said second plasma by-products from said localized plasma source through said output port, (c) a workpiece-to-ceiling gap and (d) rotational speed.

17. The process of claim 15 wherein said directing said first plasma by-products from said output port of said localized plasma source to a target zone of the backside comprises directing a localized stream of said by-products to said target zone, said target zone having a diameter corresponding to a diameter of said stream.

18. A process for stripping photoresist from a front side of a workpiece, comprising:
  supporting said workpiece on the backside in a vacuum chamber while leaving exposed a peripheral portion of said backside;
  providing a localized plasma source adjacent a sidewall of the chamber and having an output port contained in said side wall and opening to the interior of said chamber;
  holding said workpiece in a first position in said chamber above the level of the top of said output port of said localized plasma source;
  removing polymer from the backside of said workpiece, said removing comprising generating a plasma containing polymer etch species in the localized plasma source, and flowing, drifting or diffusing first plasma by-products through said output port;
  placing said workplace in a position below the level of the bottom of said output port of said localized plasma source; and
  stripping photoresist from a front side of the workpiece, said stripping comprising generating a plasma containing photoresist removal species in said localized plasma source, and flowing, drifting or diffusing second plasma by-products from said localized plasma source through said output port.

19. The process of claim 18 wherein flowing the second plasma by-products comprises directing said second plasma by-products from said output port of said localized plasma source to a target zone while rotating the workpiece.

20. The process of claim 18 further comprising:
  flowing a non-reactive species gas through a ceiling of said chamber into said upper process zone, said upper process zone comprising a volume in said vacuum chamber adjacent said front side of said workpiece; and
  adjusting the uniformity of photoresist removal rate by adjusting: (a) a flow rate: of said non-reactive species gas, (b) a flow rate of said second plasma by-products from said localized plasma source through said output port, (c) a workplace-to-ceiling gap and d) rotational speed.

* * * * *